US010460647B2

(12) United States Patent
Shishido

(10) Patent No.: US 10,460,647 B2
(45) Date of Patent: Oct. 29, 2019

(54) DISPLAY DEVICE AND ELECTRONIC DEVICE

(71) Applicant: Semiconductor Energy Laboratory Co., Ltd., Kanagawa-ken (JP)

(72) Inventor: Hideaki Shishido, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 106 days.

(21) Appl. No.: 15/641,709

(22) Filed: Jul. 5, 2017

(65) Prior Publication Data

US 2018/0012536 A1 Jan. 11, 2018

(30) Foreign Application Priority Data

Jul. 7, 2016 (JP) .................................. 2016-135142

(51) Int. Cl.
*G09G 3/20* (2006.01)
*G09G 3/36* (2006.01)
(Continued)

(52) U.S. Cl.
CPC ....... *G09G 3/2092* (2013.01); *G02F 1/13306* (2013.01); *G02F 1/133553* (2013.01); *G02F 1/133555* (2013.01); *G06F 3/0412* (2013.01); *G06F 3/0416* (2013.01); *G09G 3/3225* (2013.01); *G09G 3/3648* (2013.01); *H01L 27/281* (2013.01); *H01L 27/323* (2013.01);
(Continued)

(58) Field of Classification Search
CPC .... H01L 27/281; H01L 27/0688; H01L 27/15
See application file for complete search history.

(56) References Cited

U.S. PATENT DOCUMENTS 7,166,966 B2 * 1/2007 Naugler, Jr. ........ G06F 3/03542
257/E27.129
7,271,409 B2 * 9/2007 Young ................. H01L 27/3225
257/59
(Continued)

FOREIGN PATENT DOCUMENTS

JP         2014-211621 A         11/2014

OTHER PUBLICATIONS

Kusunoki, K. et al., "Transmissive OLED and Reflective LC Hybrid (TR-Hybrid) Display," SID Digest '16: SID International Symposium Digest of Technical Papers, May 22, 2016, vol. 47, pp. 57-60.

(Continued)

Primary Examiner — Phat X Cao
Assistant Examiner — Diana C Vieira
(74) Attorney, Agent, or Firm — Husch Blackwell LLP

(57) ABSTRACT

A display device with a narrow bezel is provided. The display device includes a pixel circuit and a driver circuit provided on one plane. The driver circuit includes a selection circuit and a buffer circuit. The buffer circuit includes a first transistor and a second transistor. Sources of the first and second transistors are electrically connected with each other. Drains of the first and second transistors are electrically connected with each other. Gates of the first and second transistors are electrically connected with each other. The first transistor and the second transistor are stacked so that the direction of the current flow in the first transistor is parallel to that in the second transistor.

22 Claims, 20 Drawing Sheets

(51) Int. Cl.

| | |
|---|---|
| *G09G 3/3225* | (2016.01) |
| *G02F 1/133* | (2006.01) |
| *H01L 27/32* | (2006.01) |
| *H01L 29/786* | (2006.01) |
| *H01L 27/28* | (2006.01) |
| *G06F 3/041* | (2006.01) |
| *G02F 1/1335* | (2006.01) |
| *G02F 1/1333* | (2006.01) |
| *H01L 27/12* | (2006.01) |

(52) U.S. Cl.
CPC ...... *H01L 27/3211* (2013.01); *H01L 27/3248* (2013.01); *H01L 27/3262* (2013.01); *H01L 27/3267* (2013.01); *H01L 27/3276* (2013.01); *H01L 29/7869* (2013.01); *G02F 1/13338* (2013.01); *G02F 1/133345* (2013.01); *G02F 2001/133354* (2013.01); *G02F 2001/133567* (2013.01); *G02F 2201/44* (2013.01); *G02F 2203/01* (2013.01); *G02F 2203/02* (2013.01); *G02F 2203/09* (2013.01); *G06F 3/041* (2013.01); *G06F 2203/04103* (2013.01); *G09G 2300/0426* (2013.01); *G09G 2300/0876* (2013.01); *G09G 2310/0291* (2013.01); *H01L 27/124* (2013.01); *H01L 27/1225* (2013.01)

(56) References Cited

U.S. PATENT DOCUMENTS

| | | |
|---|---|---|
| 9,041,453 B2 | 5/2015 | Miyake et al. |
| 9,478,187 B2 | 10/2016 | Miyake et al. |
| 2005/0200296 A1* | 9/2005 | Naugler, Jr. ........... H05B 37/02 315/150 |
| 2006/0220077 A1* | 10/2006 | Hayashi ................ G06F 3/0412 257/291 |
| 2015/0145833 A1* | 5/2015 | Yamazaki ............... G06F 3/042 345/175 |
| 2015/0155334 A1* | 6/2015 | Lu ....................... H01L 27/2436 257/4 |
| 2015/0249053 A1* | 9/2015 | Or-Bach ............. H01L 23/5386 257/401 |
| 2018/0026037 A1 | 1/2018 | Shishido et al. |

OTHER PUBLICATIONS

Sakuishi, T. et al., "Transmissive OLED and Reflective LC Hybrid (TR-Hybrid) Display with High Visibility and Low Power Consumption," SID Digest '16: SID International Symposium Digest of Technical Papers, May 22, 2016, vol. 47, pp. 735-738.

Ohide, T. et al., "Application of Transfer Technology to Manufacturing of Transmissive OLED and Reflective LC Hybrid (TR-Hybrid) Display," SID Digest '16: SID International Symposium Digest of Technical Papers, May 22, 2016, vol. 47, pp. 1002-1004.

\* cited by examiner

DISPLAY DEVICE AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a semiconductor device, a light-emitting device, a display device, an electronic device, a lighting device, a driving method thereof, or a manufacturing method thereof. In particular, one embodiment of the present invention relates to a display device (display panel). Another embodiment of the present invention relates to an electronic device, a light-emitting device, or a lighting device that includes a display device, or a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. A light-emitting device, a display device, an electronic device, a lighting device, and an electronic device may include a semiconductor device.

2. Description of the Related Art

A display device such as a liquid crystal display device or an EL display device that is used for an electronic device or other devices has been required to have a narrower bezel so as to be reduced in size and designed more freely. In order to narrow a bezel, it is effective to provide a pixel portion and a part or the whole of a driver circuit over one substrate.

The driver circuit is commonly formed using complementary metal oxide semiconductor (CMOS) circuits; however, the driver circuit can be formed using transistors having the same conductivity. For example, Patent Document 1 discloses a technique in which circuits such as a shift register are formed using transistors having the same conductivity.

REFERENCE

Patent Document

[Patent Document 1] Japanese Published Patent Application No. 2014-211621

SUMMARY OF THE INVENTION

One object of one embodiment of the present invention is to provide a display device with a narrow bezel. Another object is to provide a display device including a driver circuit having a stacked structure. Another object is to provide a display device that includes driver circuits including transistors having the same conductivity. Another object is to provide a display device with high visibility. Another object is to provide a low-power display device. Another object is to provide a novel display device. Another object is to provide an electronic device including the display device (display panel). Another object is to provide a novel electronic device.

Note that the descriptions of these objects do not disturb the existence of other objects. In one embodiment of the present invention, there is no need to achieve all the objects. Objects other than the above objects are apparent from and can be derived from the description of the specification and the like.

One embodiment of the present invention relates to a driver circuit with which the bezel of a display device can be narrowed.

One embodiment of the present invention is a display device including a pixel circuit and a driver circuit provided on one plane. The driver circuit includes a selection circuit and a buffer circuit. The buffer circuit includes a first transistor and a second transistor. The second transistor has a region overlapping with the first transistor. A source of the first transistor is electrically connected to a source of the second transistor. A drain of the first transistor is electrically connected to a drain of the second transistor. A gate of the first transistor is electrically connected to a gate of the second transistor. The gate of the first transistor and the gate of the second transistor are electrically connected to the selection circuit. The sources of the first and second transistors or the drains of the first and second transistors are electrically connected to the pixel circuit.

Another embodiment of the present invention is a display device including a pixel circuit and a driver circuit provided on one plane. The driver circuit includes a selection circuit and a buffer circuit. The buffer circuit includes a first transistor and a second transistor. The pixel circuit includes a third transistor and a fourth transistor. The second transistor has a region overlapping with the first transistor. The fourth transistor has a region overlapping with the third transistor. A source of the first transistor is electrically connected to a source of the second transistor. A drain of the first transistor is electrically connected to a drain of the second transistor. A gate of the first transistor is electrically connected to a gate of the second transistor. The gate of the first transistor and the gate of the second transistor are electrically connected to the selection circuit. The sources of the first and second transistors or the drains of the first and second transistors are electrically connected to a gate of the third transistor.

The first and second transistors are stacked so that the direction of the current flow in the first transistor is parallel to that in the second transistor.

Transistors comprised in the driver circuit and the pixel circuit have the same conductivity and each contain a metal oxide in a channel formation region, for example.

A channel width of the first transistor is preferably equal to that of the second transistor.

The pixel circuit can include a first display element. The first display element is configured to emit or transmit visible light.

The pixel circuit can further include a second display element. The second display element is configured to reflect visible light.

Note that in this specification, the display device might include any of the following modules: a module in which a connector such as a flexible printed circuit (FPC) or a tape carrier package (TCP) is attached to a display panel; a module having a TCP provided with a printed wiring board at the end thereof; and a module having an integrated circuit (IC) directly mounted by a chip on glass (COG) method over a substrate over which a display element is formed.

With one embodiment of the present invention, a display device with a narrow bezel can be provided. A display device including a driver circuit having a stacked structure can be provided. A display device that includes driver circuits including transistors having the same conductivity can be provided. A display device with high visibility can be provided. A low-power display device can be provided. A novel display device can be provided. An electronic device including the display device (display panel) can be provided. A novel electronic device can be provided.

Note that the description of these effects does not preclude the existence of other effects. In one embodiment of the present invention, there is no need to obtain all the effects. Other effects are apparent from and can be derived from the description of the specification, the drawings, the claims, and the like.

BRIEF DESCRIPTION OF THE DRAWINGS

FIGS. 15A, 15B1, and 15B2 are a block diagram illustrating a display device and diagrams illustrating electrodes included in pixels.

DETAILED DESCRIPTION OF THE INVENTION

Figure 1:
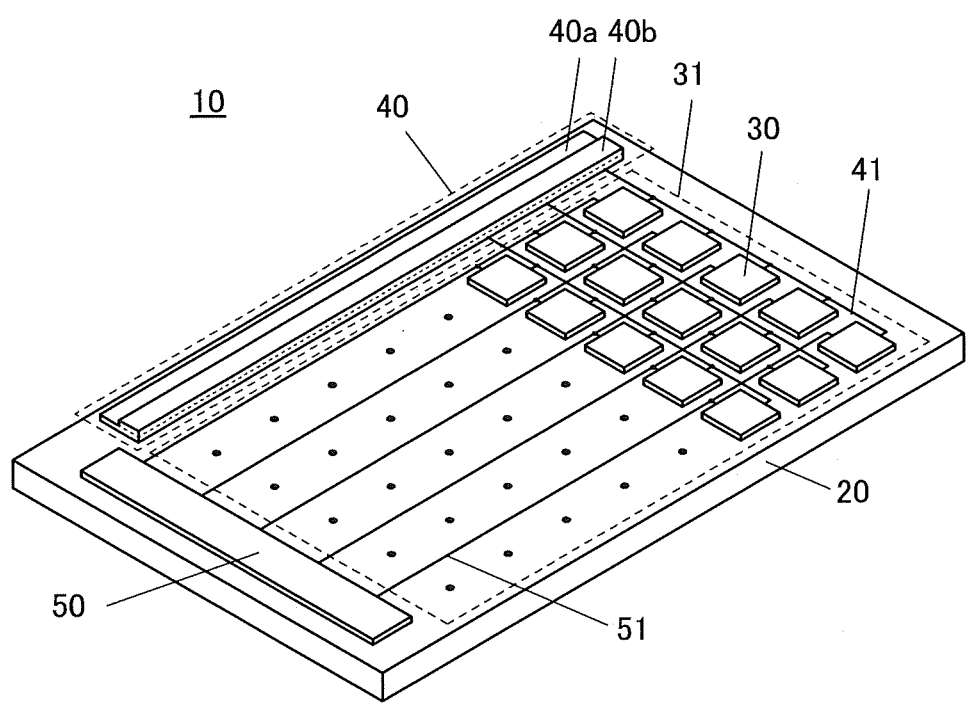
FIG. 1 illustrates a display device.

Embodiments are described in detail with reference to the drawings. Note that the present invention is not limited to the description below, and it is easily understood by those skilled in the art that various changes and modifications can be made without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatching pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first," "second," and the like are used in order to avoid confusion among components and do not limit the number.

Embodiment 1

In this embodiment, a display device of one embodiment of the present invention is described with reference to drawings.

The display device of one embodiment of the present invention is a display device including a pixel circuit and a driver circuit provided on one plane. The driver circuit includes a selection circuit and a buffer circuit. The buffer circuit includes a first transistor and a second transistor connected in parallel. The first and second transistors are stacked so that the direction of the current flow in the first transistor is parallel to that in the second transistor.

A signal output from the selection circuit is input to the buffer circuit. The buffer circuit outputs the signal to a gate line with high capacitance to which a plurality of pixels are connected in parallel, or the like. Thus, in the buffer circuit, a transistor with a large channel width is used; however, the transistor with a large channel width inhibits the bezel from being narrowed.

In one embodiment of the present invention, the area occupied by a buffer circuit portion can be reduced by dividing a transistor used for the buffer circuit into two transistors and stacking the two transistors. Thus, the width of the bezel of the display device can be narrowed.

FIG. 1 is a schematic perspective view of a display device 10 of one embodiment of the present invention and illustrates a display portion 31, a driver circuit 40, and a driver circuit 50 that are provided over a substrate 20. The display portion 31 includes pixels 30 arranged in matrix. The pixel 30 is electrically connected to the driver circuit 40 via a wiring 41. Furthermore, the pixel 30 is electrically connected to the driver circuit 50 via a wiring 51. For example, the driver circuit 40 can function as a gate driver. Moreover, the driver circuit 50 can function as a source driver.

In one embodiment of the present invention, the bezel of the display device is narrowed by making the driver circuit 40 have a structure in which a layer 40a and a layer 40b are stacked. Note that in this embodiment, an example in which the driver circuit 40 has the stacked structure is described; however, the driver circuit 50 can also have a stacked structure similar to the driver circuit 40.

The driver circuit 40 is described with reference to schematic views of FIGS. 2B to 2D. The driver circuit 40 includes a shift register circuit 60 and a buffer circuit 70. The buffer circuit 70 includes a transistor 71 or transistors 71a and 71b. A wiring 21 is an output line of the shift register circuit 60. A wiring 22 is a signal line or a power supply line. The wiring 41 is a gate line connected to the pixels. Note that although FIGS. 2B to 2D are schematic cross-sectional views, the positional relation between a source and a drain of the transistor in the drawings is different from the actual one for clarity of the connection relation of wirings.

Figure 2A:
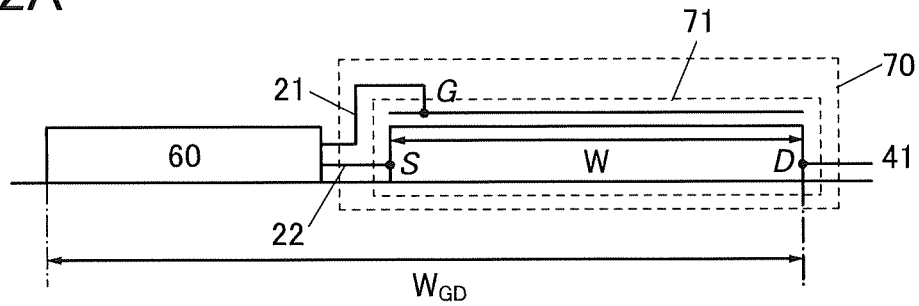
FIGS. 2A to 2D illustrate driver circuits.

FIG. 2A is a schematic view of a conventional driver circuit. A gate of the transistor 71 is connected to the wiring 21. One of a source and a drain of the transistor 71 is connected to the wiring 22. The other of the source and the drain of the transistor 71 is connected to the wiring 41. Note that the source and the drain are interchanged with each other by the operation of the transistor.

Here, the channel width of the transistor 71 is W, and the width of the driver circuit 40 is $W_{GD}$. As described above, the buffer circuit 70 needs a transistor with a large channel width. An example in which a transistor including a metal oxide in the channel formation region is used is given below. In the case of an organic EL panel having a diagonal size of 13.3 inches and including 8K×4K pixels, whereas the maximum channel width of a transistor used in a shift register circuit is approximately 300 μm, the channel width of a transistor used in a buffer circuit is approximately 2000 μm. Thus, the ratio of W to $W_{GD}$ is very high.

Figure 2B:
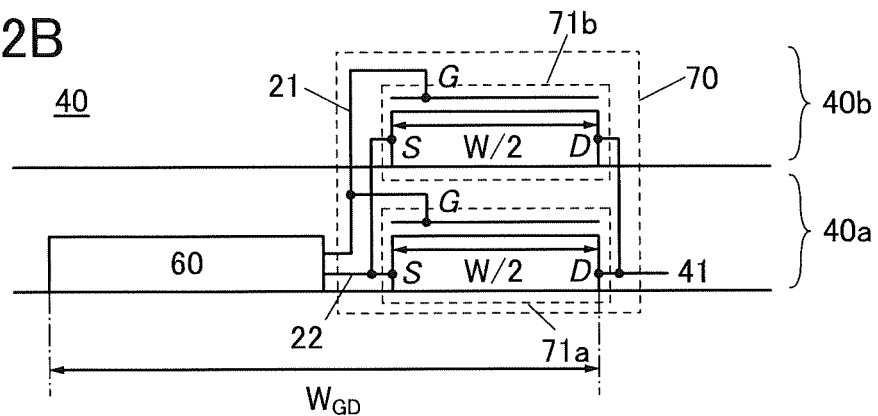
Figure 2C:
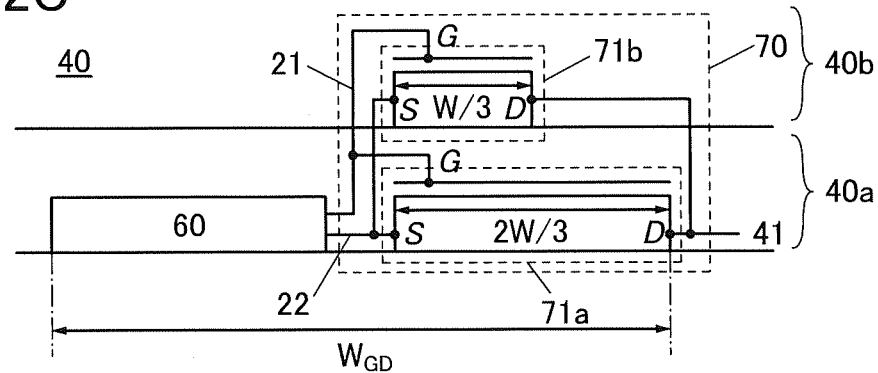
Figure 2D:
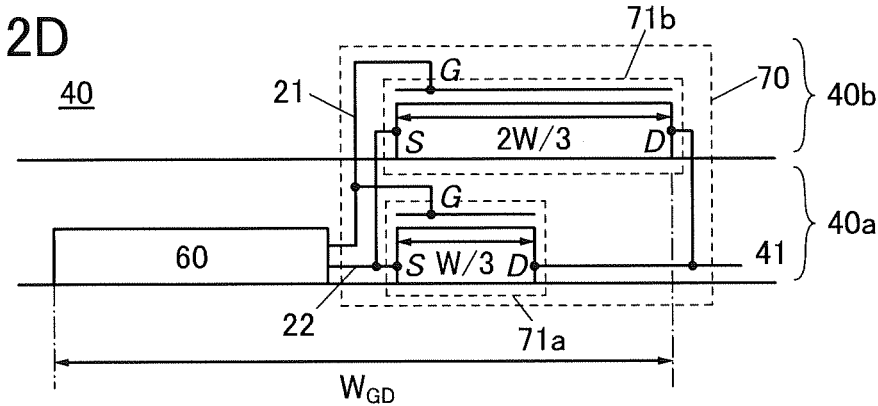

FIG. 2B is a schematic view of the driver circuit 40 of one embodiment of the present invention. The transistor 71 illustrated in FIG. 2A is divided into two transistors, which are the transistor 71a and the transistor 71b that each have the channel width of W/2. The shift register circuit 60 and the transistor 71a are provided in the layer 40a, and the transistor 71b is provided in the layer 40b to overlap with the transistor 71a. With such a structure, the area occupied by the transistors included in the buffer circuit 70 can be reduced, so that $W_{GD}$ can be small. Thus, the width of the bezel of the display device can be narrowed.

Note that as illustrated in FIGS. 2C and 2D, the channel width of the transistor 71a may differ from that of the transistor 71b. For example, one of the transistors 71a and 71b can have a channel width of W/3, and the other can have a channel width of 2W/3. As another example, one of the transistors 71a and 71b can have a channel width of W/4, and the other can have a channel width of 3W/4. Also with such a structure, the area occupied by the transistors included in the buffer circuit 70 can be reduced, so that $W_{GD}$ can be small.

Figure 3:
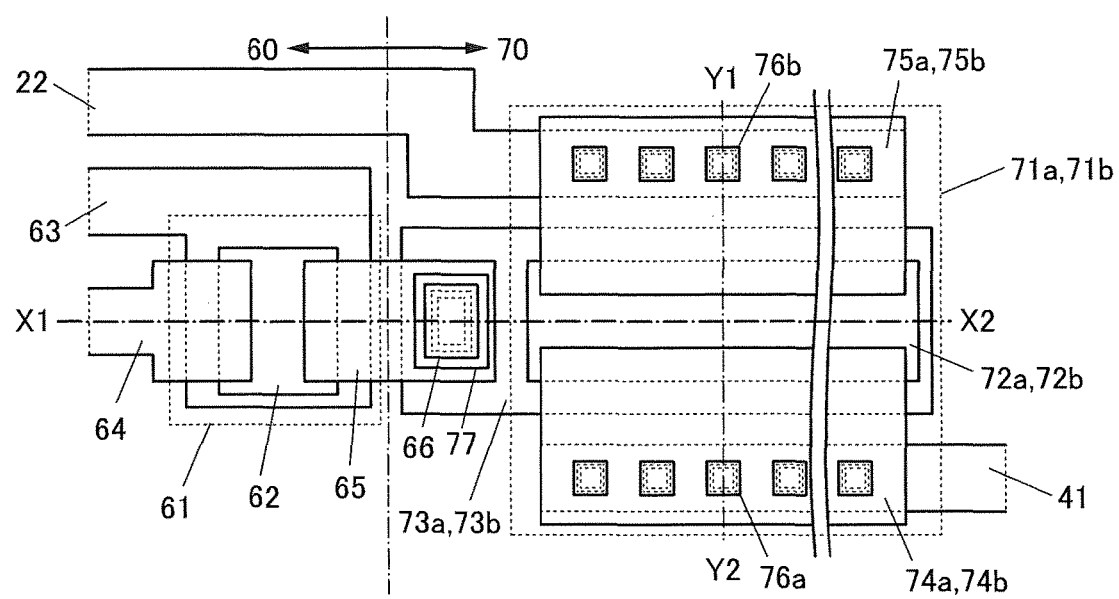
FIG. 3 is a top view illustrating a driver circuit.
Figure 4A:
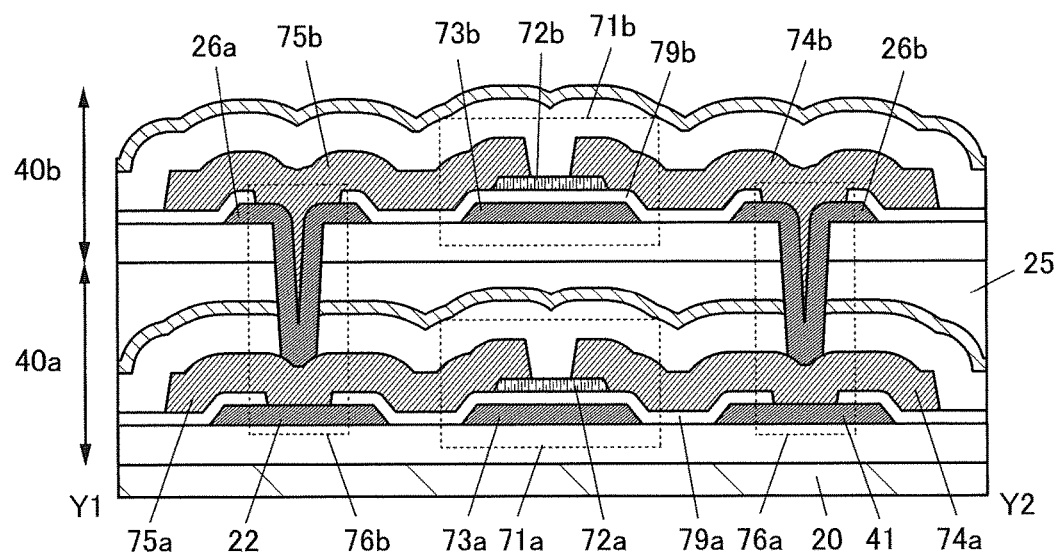
FIGS. 4A and 4B are cross-sectional views illustrating a driver circuit.
Figure 4B:
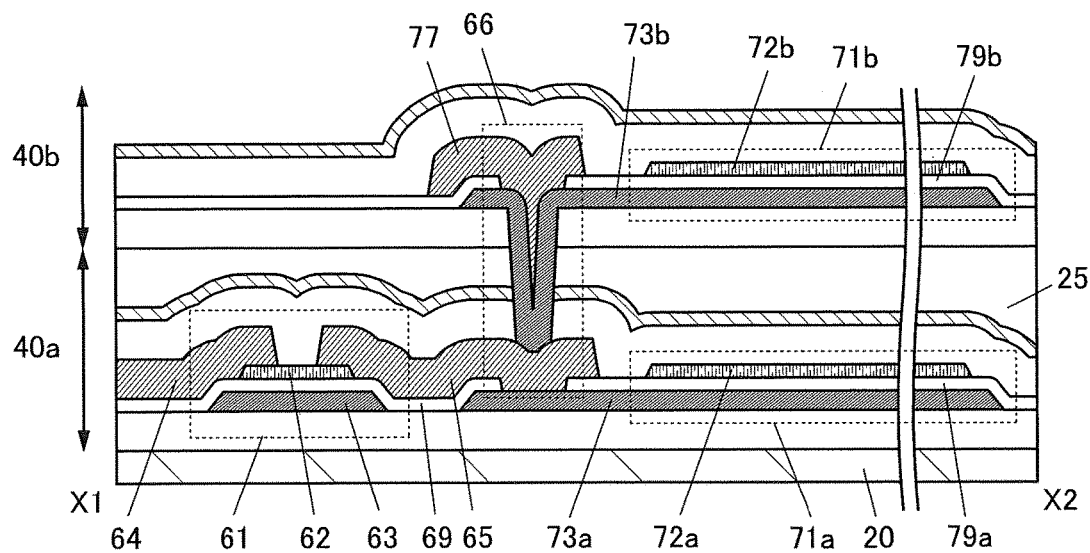

FIG. 3 illustrates an example of a top view of part of the shift register circuit 60 and the transistors of the buffer circuit 70 illustrated in FIG. 2B. FIG. 4A is a cross-sectional view taken along line Y1-Y2 of FIG. 3, and FIG. 4B is a cross-sectional view taken along line X1-X2 of FIG. 3. Note that some insulating layers and the like are not illustrated or their reference numerals are omitted for simplicity.

As a component of the shift register circuit 60, a transistor 61 for outputting a signal is illustrated. The transistor 61 includes a gate electrode 63, a gate insulating film 69, a semiconductor layer 62, a source electrode 64, and a drain electrode 65.

As components of the buffer circuit 70, the transistor 71a and the transistor 71b are illustrated. The transistor 71a includes a gate electrode 73a, a gate insulating film 79a, a semiconductor layer 72a, a source electrode 75a, and a drain electrode 74a. The transistor 71b includes a gate electrode 73b, a gate insulating film 79b, a semiconductor layer 72b, a source electrode 75b, and a drain electrode 74b.

The transistor 71a and the transistor 71b have the same size and are stacked in the same direction, so that the area occupied by the transistors can be minimized. Thus, as illustrated in FIG. 3 and FIGS. 4A and 4B, the transistors 71a and 71b are preferably stacked so that the direction of current flow in the transistor 71a is parallel to that in the transistor 71b. That is, the whole channel formation region of the transistor 71a and the whole channel formation region of the transistor 71b preferably overlap with each other. Note that each of the transistors is not limited to a bottom-gate transistor but may be a top-gate transistor. A planarization film 25 provided between the transistors 71a and 71b may be omitted.

The source electrode 75a of the transistor 71a is electrically connected to the source electrode 75b of the transistor 71b in a connection portion 76b. The drain electrode 74a of the transistor 71a is electrically connected to the drain electrode 74b of the transistor 71b in a connection portion 76a. Here, the connection portions 76a and 76b include conductive layers 26a and 26b that can be provided in the same step as the gate electrode 73b in FIG. 4A; however, the conductive layers 26a and 26b are not necessarily provided, and the source electrodes of the transistors 71a and 71b may be directly in contact with each other and the drain electrodes of the transistors 71a and 71b may be directly in contact with each other.

The gate electrode 73a of the transistor 71a is electrically connected to the drain electrode 65 of the transistor 61 and the gate electrode 73b of the transistor 71b in a connection portion 66. Here, in FIG. 4B, the connection portion 66 includes a conductive layer 77 that can be provided in the same step as the source electrode 75b and the drain electrode 74b; however, the conductive layer 77 is not necessarily provided.

Figure 5A:
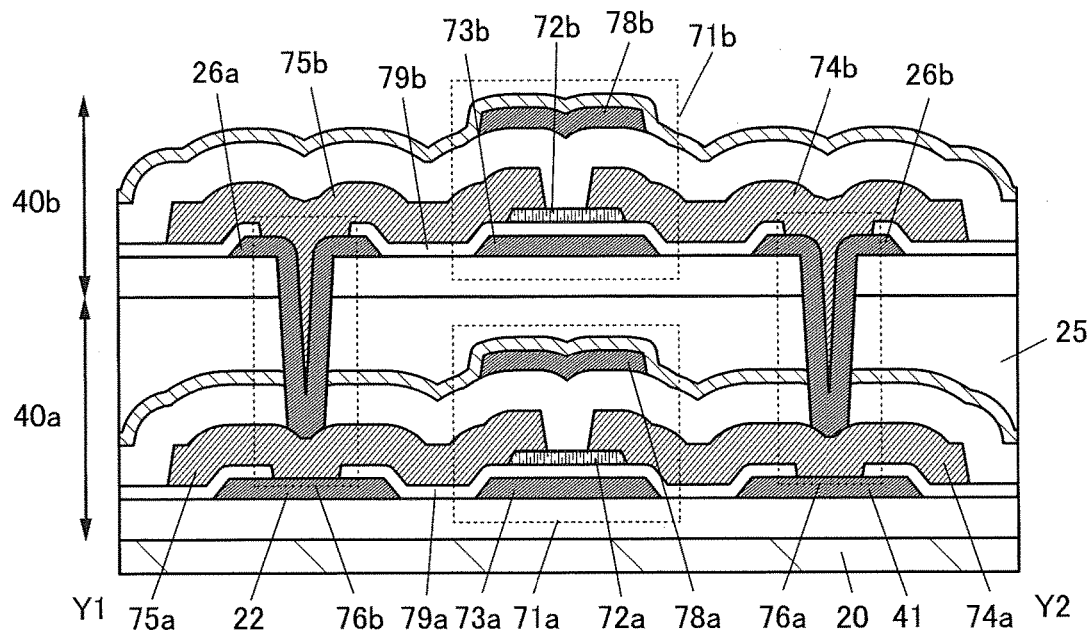
FIGS. 5A and 5B are cross-sectional views illustrating a driver circuit.
Figure 5B:
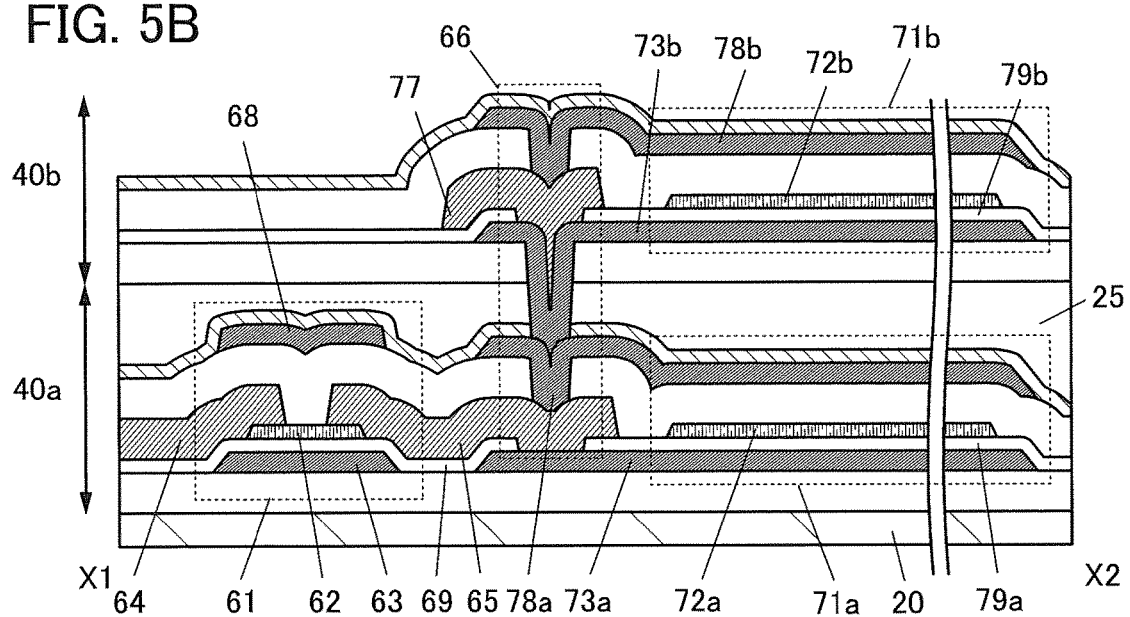

Each of the transistors 61, 71a, and 71b may include a conductive layer functioning as a second gate electrode. FIGS. 5A and 5B illustrate a structure in which conductive layers 68, 78a, and 78b are provided in the transistors 61, 71a, and 71b, respectively.

The second gate electrode has a function of controlling the threshold voltage of a transistor by being supplied with a low potential, and has a function of increasing on-state current by being supplied with the same potential as that of a front gate electrode of a transistor. Here, in order to give the latter function to the transistors 71a and 71b, the gate electrode 73a, the conductive layer 78a, the gate electrode 73b, and the conductive layer 78b are electrically connected to each other in the connection portion 66 as illustrated in FIG. 5B. Moreover, the gate electrode 63 and the conductive layer 68 are electrically connected to each other in a region (not illustrated) of the transistor 61.

Figure 6A:
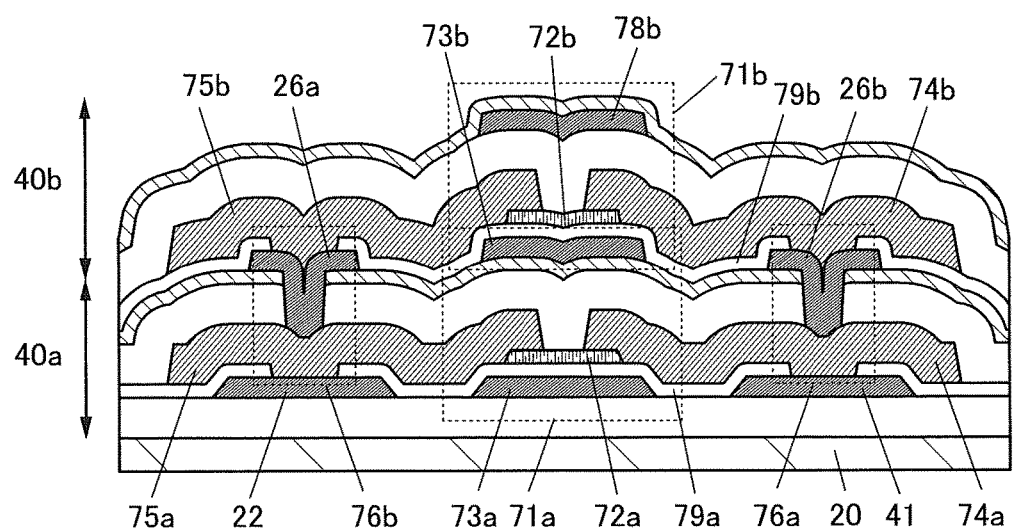
FIGS. 6A and 6B are cross-sectional views illustrating a driver circuit.
Figure 6B:
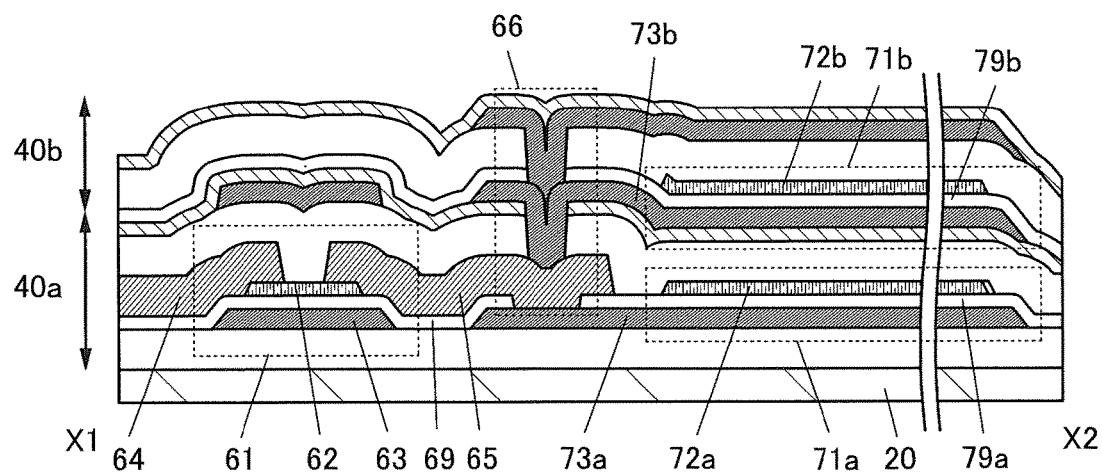

FIGS. 6A and 6B illustrate a structure in which the second gate electrodes are provided in the transistors 61, 71a, and 71b and the planarization film 25 is not provided. In this case, the electric field from the gate electrode 73b of the transistor 71b is likely to be applied to the semiconductor layer 72a of the transistor 71a; thus, the gate electrode 73b can function as a second gate electrode of the transistor 71a. Thus, the conductive layer 78a illustrated in FIGS. 5A and 5B can be omitted, which enables simplification of the manufacturing process of the transistor.

Figure 7:
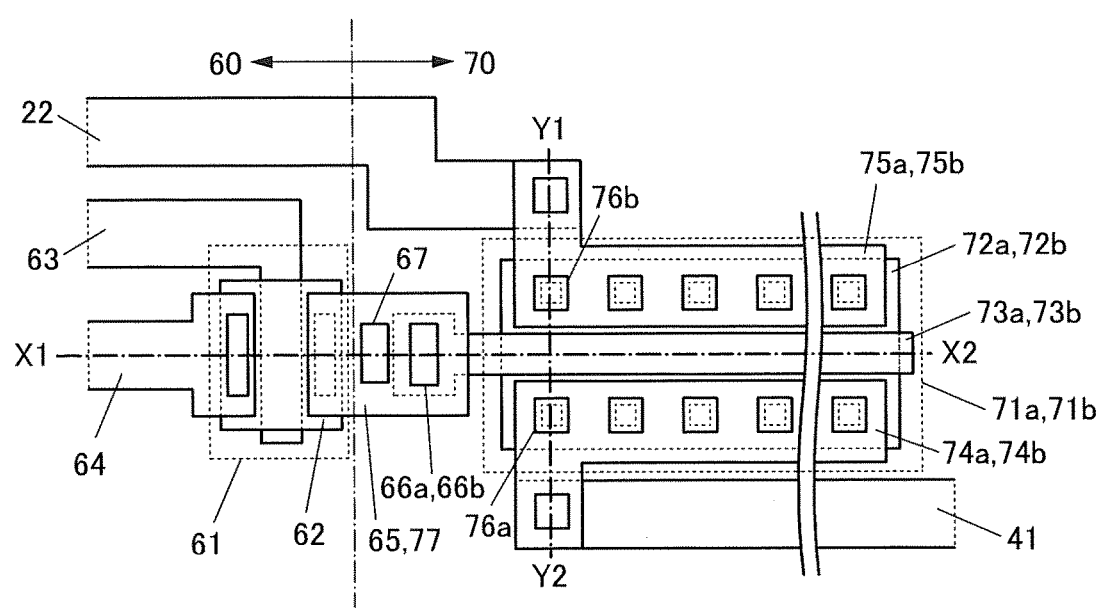
FIG. 7 is a top view illustrating a driver circuit.
Figure 8A:
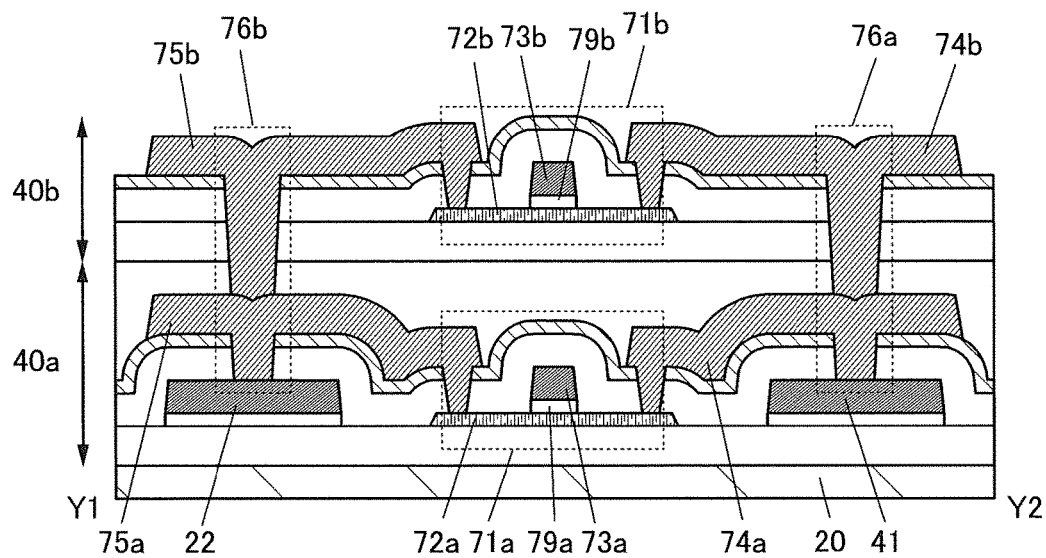
FIGS. 8A and 8B are cross-sectional views illustrating a driver circuit.
Figure 8B:
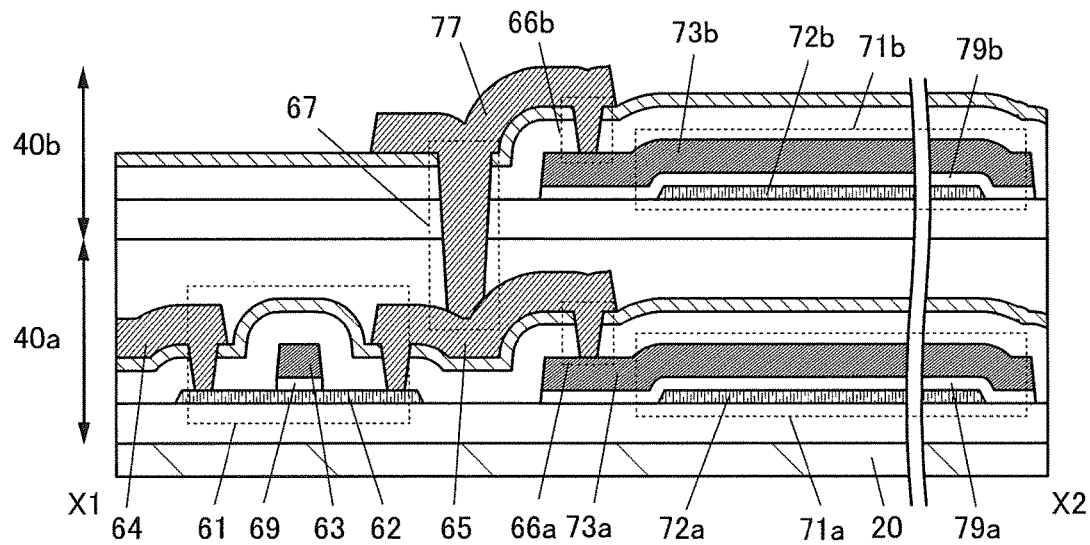
Figure 9A:
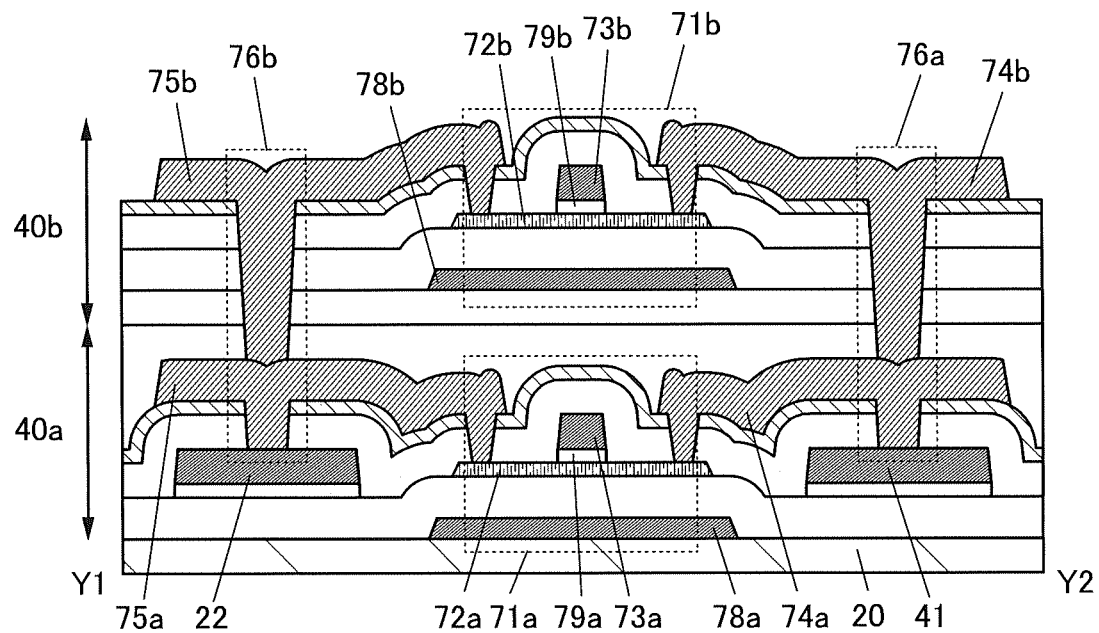
FIGS. 9A and 9B are cross-sectional views illustrating a driver circuit.
Figure 9B:
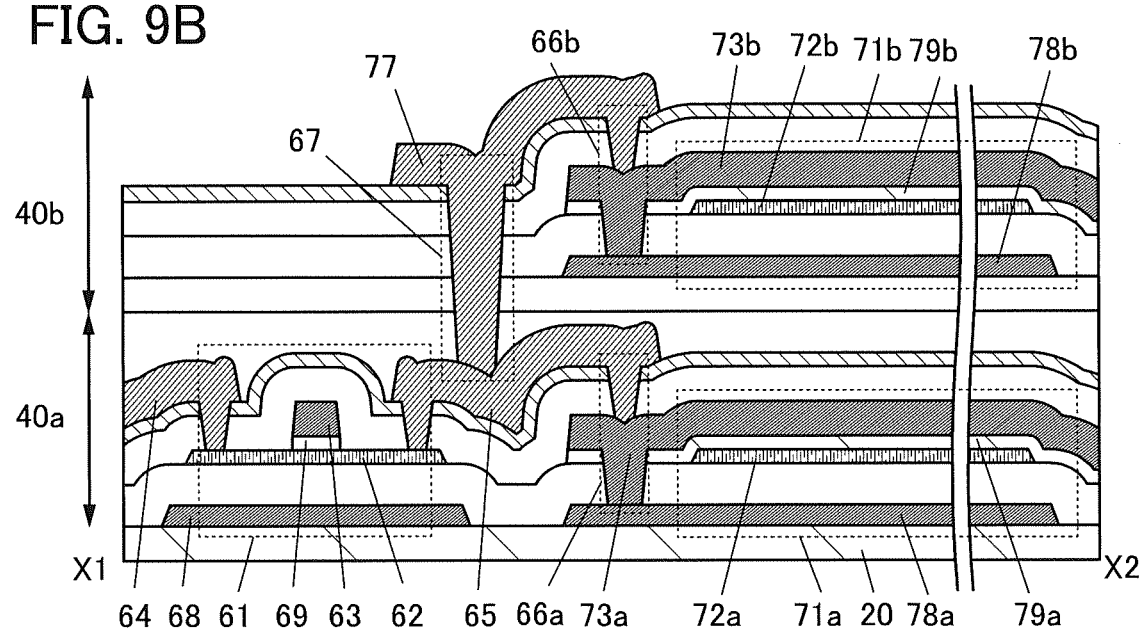

FIG. 7, FIGS. 8A and 8B, FIGS. 9A and 9B illustrate structures in which the bottom-gate transistors illustrated in FIG. 3, FIGS. 4A and 4B, and FIGS. 5A and 5B are replaced with self-aligned top-gate transistors. FIG. 7 is a top view, FIG. 8A is a cross-sectional view taken along line Y1-Y2 of FIG. 7, and FIG. 8B is a cross-sectional view taken along line X1-X2 of FIG. 7. FIGS. 9A and 9B illustrate a structure in which the transistors 61, 71a, and 71b include the conductive layers 68, 78a, and 78b functioning as the second gate electrodes.

As a modification example of the connection portion 66 illustrated in FIG. 3, FIGS. 4A and 4B, and FIGS. 5A and 5B, a structure in which the drain electrode 65 in a connection portion 66a is electrically connected to the conductive layer 77 in connection portions 66b and 67 is illustrated in FIG. 7, FIGS. 8A and 8B, FIGS. 9A and 9B. Note that the connection portions 66 illustrated in FIG. 3, FIGS. 4A and 4B, and FIGS. 5A and 5B may be used in the structures illustrated in FIG. 7, FIGS. 8A and 8B, FIGS. 9A and 9B.

The structures illustrated in FIG. 3, FIGS. 4A and 4B, and FIGS. 5A and 5B and the structures illustrated in FIG. 7, FIGS. 8A and 8B, and FIGS. 9A and 9B may be combined.

Figure 10A:
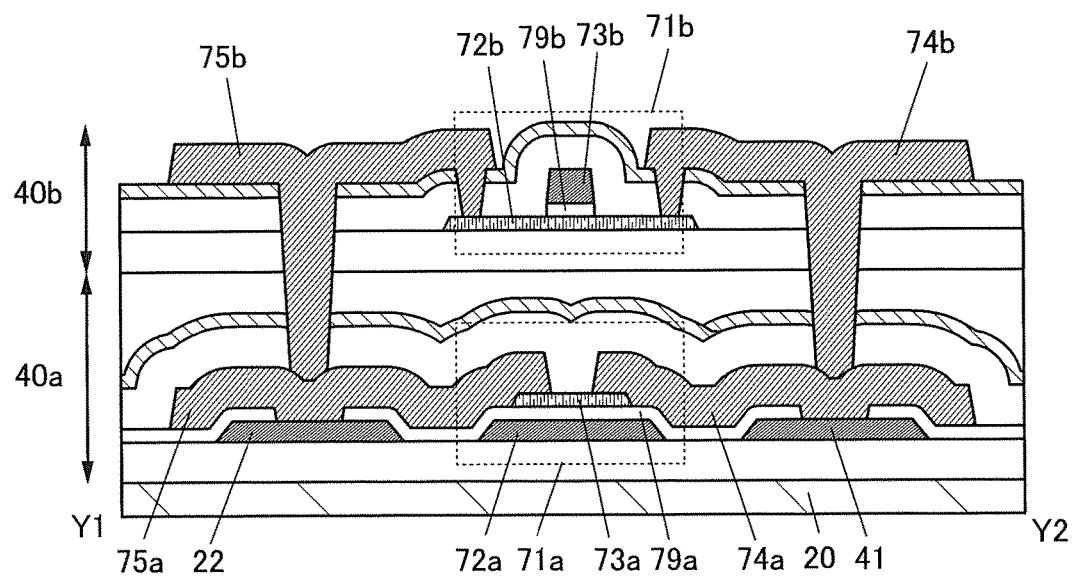
FIGS. 10A and 10B are cross-sectional views illustrating a driver circuit.
Figure 10B:
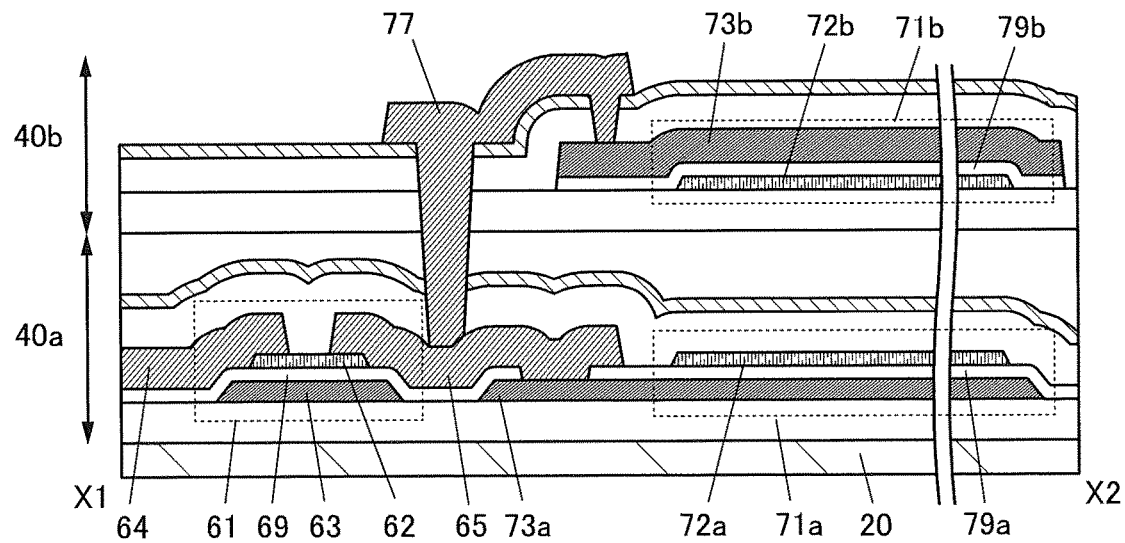
Figure 11A:
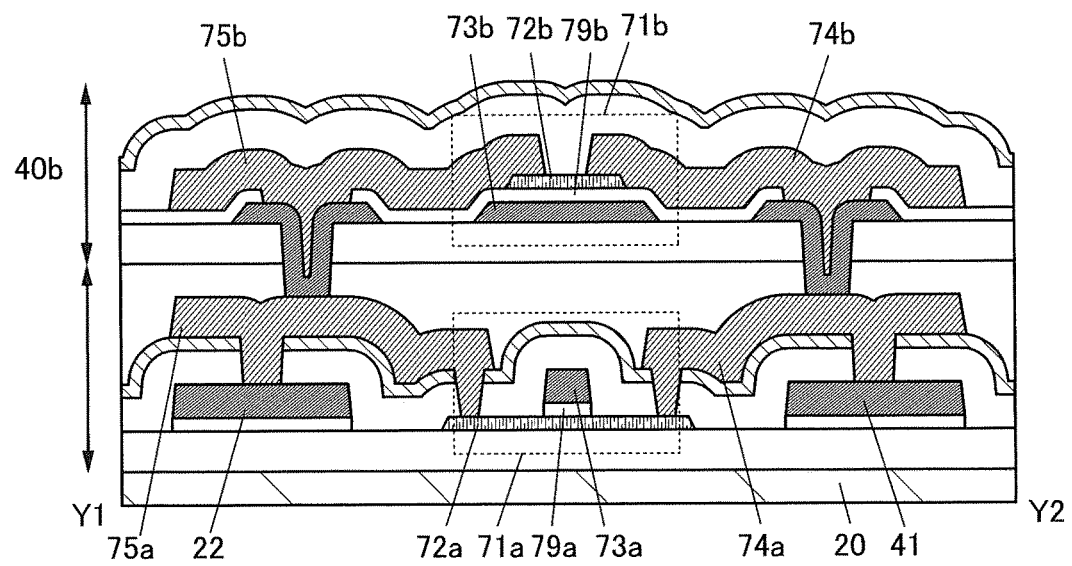
FIGS. 11A and 11B are cross-sectional views illustrating a driver circuit.
Figure 11B:
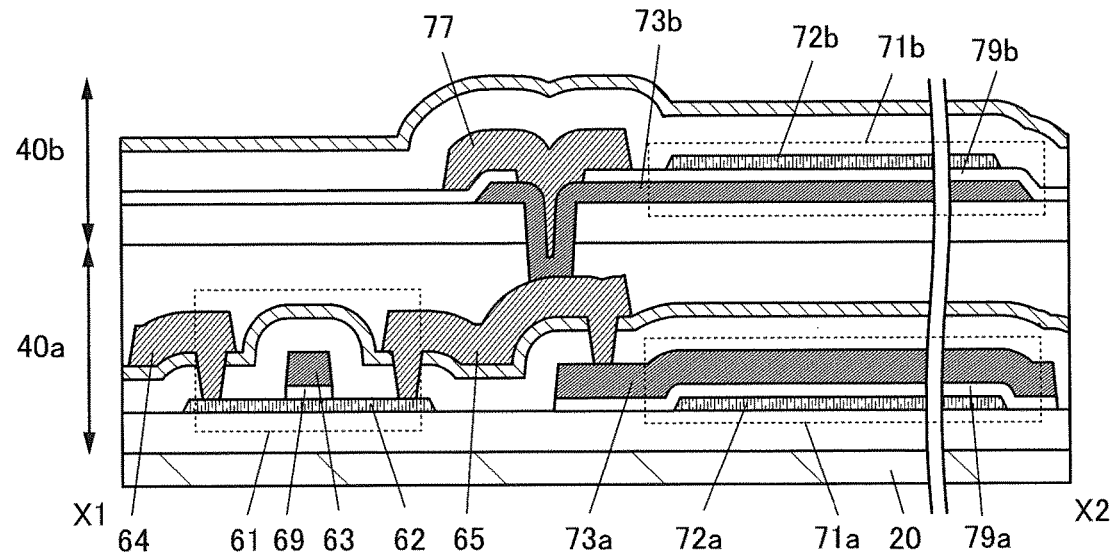

For example, as illustrated in FIGS. 10A and 10B, the transistor 61 and the transistor 71a may be bottom-gate transistors and the transistor 71b may be a top-gate transistor. Alternatively, as illustrated in FIGS. 11A and 11B, the transistor 61 and the transistor 71a may be top-gate transistors and the transistor 71b may be a bottom-gate transistor.

With any of the above structures, the area occupied by the buffer circuit can be reduced. That is, the width of the driver circuit such as the gate driver can be narrowed, so that a display device with a narrow bezel can be fabricated.

An oxide semiconductor containing a metal oxide is preferably used for a semiconductor layer of a semiconductor device such as the transistors used in the pixel circuit and the driver circuit of the display device. As the oxide semiconductor, for example, a cloud-aligned composite oxide semiconductor (CAC-OS) that is described later can be used.

In particular, an oxide semiconductor having a wider band gap than silicon is preferably used. When a semiconductor material having a wider band gap and a lower carrier density than silicon is used, the off-state current of the transistor can be reduced.

Charge accumulated in a capacitor through the transistor can be retained for a long time because of low off-state current of the transistor. The use of such a transistor in pixels allows a driver circuit to stop while the gray level of an image displayed in display regions is maintained. As a result, an electronic device with extremely low power consumption can be obtained.

Alternatively, a polycrystalline semiconductor may be used for semiconductor devices such as transistors used for pixels included in display regions or driver circuits in the display device 10. For example, polycrystalline silicon or the like is preferably used. Polycrystalline silicon can be formed at a lower temperature than single crystal silicon and has higher field effect mobility and higher reliability than amorphous silicon. When such a polycrystalline semiconductor is used for a pixel, the aperture ratio of the pixel can be improved. Even when a very large number of pixels are provided, a gate driver circuit and a source driver circuit can be formed over a substrate where the pixels are formed, so that the number of components of an electronic device can be reduced.

At least part of this embodiment can be implemented in combination with any of the other embodiments described in this specification as appropriate.

Embodiment 2

In this embodiment, a driver circuit of a display device that can be used as one embodiment of the present invention is described with reference to FIGS. 12A to 12C.

The driver circuit of the display device described in this embodiment includes a shift register circuit and a buffer circuit. Note that the buffer circuit is included in a shift register circuit in some cases.

Figure 12A:
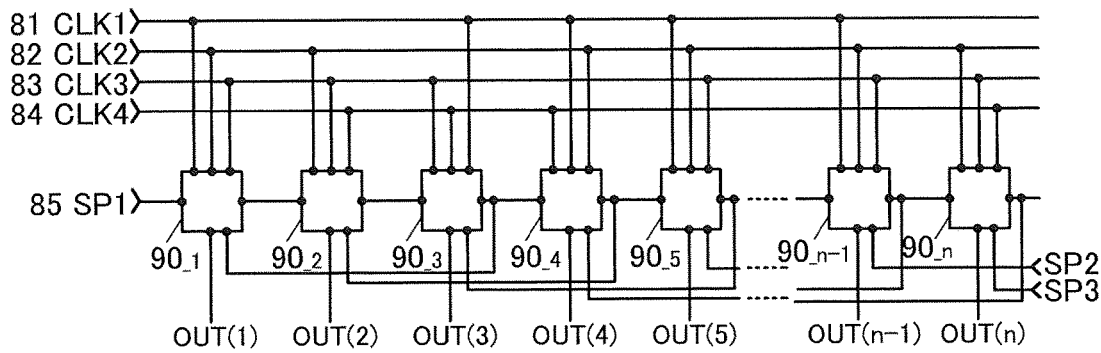
FIGS. 12A to 12C are block diagrams and a circuit diagram of a driver circuit.

A shift register circuit described in this embodiment includes pulse signal output circuits 90, which are pulse signal output circuits $90_{\_1}$ to $90_{\_n}$ (n is a natural number greater than or equal to 2), and signal lines 81 to 84 that transmit clock signals (see FIG. 12A). A clock signal CLK1 is supplied to the signal line 81. A clock signal CLK2 is supplied to the signal line 82. A clock signal CLK3 is supplied to the signal line 83. A clock signal CLK4 is input to the signal line 84.

The clock signal is a signal that alternates between an H-level signal (high potential) and an L-level signal (low potential) at regular intervals. Here, the clock signals CLK1 to CLK4 are delayed by ¼ period sequentially. In this embodiment, by using the clock signals, control or the like of the pulse signal output circuits 90 is performed.

Figure 12B:
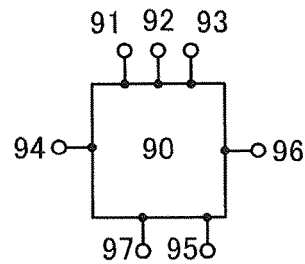

Each of the pulse signal output circuits 90 includes an input terminal 91, an input terminal 92, an input terminal 93, an input terminal 94, an input terminal 95, an output terminal 96, and an output terminal 97 (see FIG. 12B).

The input terminals 91, 92, and 93 are electrically connected to any of the signal lines 81 to 84. For example, the input terminal 91 in the pulse signal output circuit $90_{\_1}$ is electrically connected to the signal line 81, the input terminal 92 in the pulse signal output circuit $90_{\_1}$ is electrically connected to the signal line 82, and the input terminal 93 in the pulse signal output circuit $90_{\_1}$ is electrically connected to the signal line 83. In addition, the input terminal 91 in the pulse signal output circuit $90_{\_2}$ is electrically connected to the signal line 82, the input terminal 92 in the pulse signal output circuit $90_{\_2}$ is electrically connected to the signal line 83, and the input terminal 93 in the pulse signal output circuit $90_{\_2}$ is electrically connected to the signal line 84. Note that here, the case where the signal lines 82 to 84 are connected to the pulse signal output circuit $90_{\_n}$ is described. However, the signal lines that are connected to the pulse signal output circuit $90_{\_n}$ are changed depending on the value of n. Thus, the configuration described herein is just an example.

In the pulse signal output circuit $90_{\_m}$ (m is a natural number of two or more) of the shift register described in this embodiment, the input terminal 94 is electrically connected to the output terminal 96 of the pulse signal output circuit $90_{\_m-1}$, the input terminal 95 is electrically connected to the output terminal 96 of the pulse signal output circuit $90_{\_m+2}$, the output terminal 96 is electrically connected to the input terminal 94 of the pulse signal output circuit $90_{\_m+1}$, and the output terminal 97 outputs a signal to OUT(m).

For example, the input terminal 94 in the pulse signal output circuit $90_{\_3}$ is electrically connected to the output terminal 96 in the pulse signal output circuit $90_{\_2}$. The input terminal 95 in the pulse signal output circuit $90_{\_3}$ is electrically connected to the output terminal 96 in the pulse signal output circuit $90_{\_5}$. The output terminal 96 in the pulse signal output circuit $90_{\_3}$ is electrically connected to the input terminal 94 in the pulse signal output circuit $90_{\_4}$ and the input terminal 95 in the pulse signal output circuit $90_{\_1}$.

In addition, a start pulse (SP1) is input from a wiring 85 to the input terminal 94 in the pulse signal output circuit $90_{\_1}$. A pulse output from the previous stage is input to the input terminal 94 in the pulse signal output circuit $90_{\_k}$ (k is a natural number greater than or equal to 2 and less than or equal to n). A start pulse (SP2) is input to the input terminal 95 in the pulse signal output circuit $90_{\_n-1}$. A start pulse (SP3) is input to the input terminal 95 in the pulse signal output circuit $90_{\_n}$. The start pulse (SP2) and the start pulse (SP3) may be input from the outside or generated inside the circuit.

Next, the configuration of the pulse signal output circuits $90_{\_1}$ to $90_{\_n}$ is specifically described.

Figure 12C:
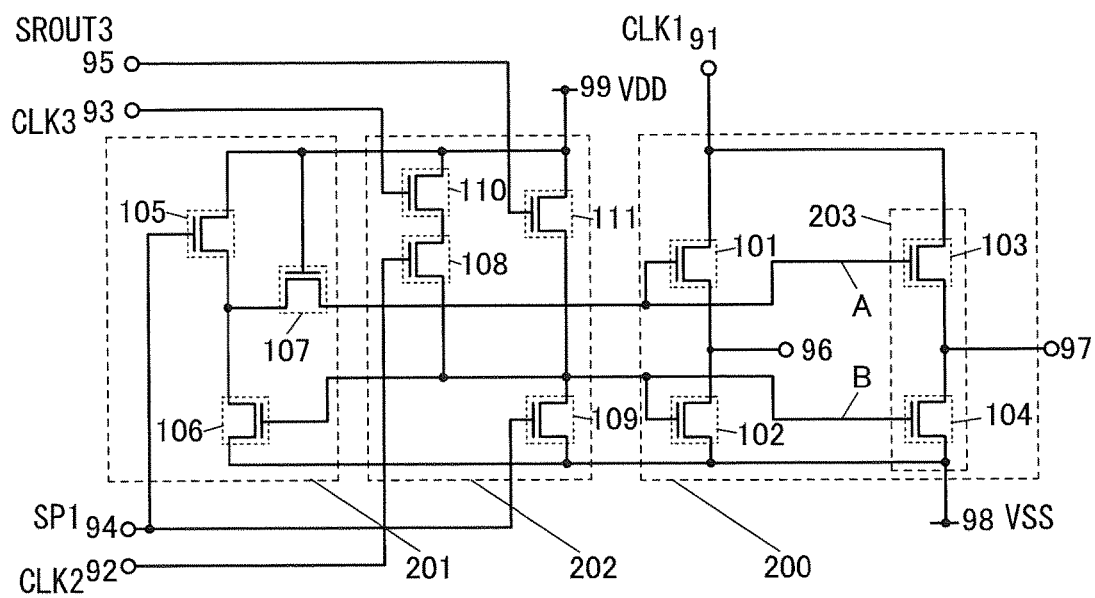

Each of the pulse signal output circuits $90_{\_1}$ to $90_{\_n}$ includes a pulse signal generation circuit 200 including transistors 101 to 104; an input signal generation circuit 201 including transistors 105 to 107; and an input signal generation circuit 202 including transistors 108 to 111 (see FIG. 12C). The transistors 101 to 111 are supplied with signals from a power supply line 98 and a power supply line 99 in addition to the above-described input terminals 91 to 95.

Note that the transistors 103 and 104 in the pulse signal generation circuit 200 are included in a buffer circuit 203. The buffer circuit 203 corresponds to the buffer circuit 70 described in Embodiment 1 with reference to FIGS. 2A to 2D and the like. Portions of the pulse signal generation circuit 200 except the buffer circuit 203, the input signal generation circuit 201, and the input signal generation circuit 202 correspond to the shift register circuit 60 described in Embodiment 1 with reference to FIGS. 2A to 2D and the like.

That is, the transistor 61 described in Embodiment 1 with reference to FIG. 3 and the like corresponds to the transistor 106, 107, 108, or 109. The transistors 71a and 71b described in Embodiment 1 with reference to FIG. 3 and the like correspond to the transistor 103 or the transistor 104.

A specific example of a configuration of the pulse signal generation circuit 200 is as follows.

A first terminal (hereinafter, "first terminal" means one of a source terminal and a drain terminal) of the transistor 101, a first terminal of the transistor 102, and the output terminal 96 are electrically connected to each other. Similarly, a first terminal of the transistor 103, a first terminal of the transistor 104, and the output terminal 97 are electrically connected to each other. A gate terminal of the transistor 101, a gate terminal of the transistor 103, and an output terminal of the input signal generation circuit 201 are electrically connected to each other. A gate terminal of the transistor 102, a gate terminal of the transistor 104, and an output terminal of the input signal generation circuit 202 are electrically connected to each other.

A second terminal (hereinafter, "second terminal" means the other of the source terminal and the drain terminal) of the transistor 101 and a second terminal of the transistor 103 are electrically connected to each other, and the clock signal CLK1 is input to a node. The second terminal of the transistor 101 and the second terminal of the transistor 103 also function as the input terminal 91 of the pulse signal output circuit 90. A second terminal of the transistor 102 is supplied with a first potential (e.g., a low potential $V_{SS}$) through the power supply line 98. A second terminal of the transistor 104 is supplied with the first potential through the power supply line 98.

A specific example of a configuration of the input signal generation circuit 201 is as follows.

A first terminal of the transistor 105, a first terminal of the transistor 106, and a first terminal of the transistor 107 are electrically connected to each other. Furthermore, a second terminal of the transistor 107 functions as the output terminal of the input signal generation circuit 201. The gate terminal of the transistor 105 functions as a first input terminal of the input signal generation circuit 201 and functions as the input terminal 94 of the pulse signal output circuit 90.

A second potential is supplied to a second terminal of the transistor 105 through the power supply line 99. The first potential is supplied to a second terminal of the transistor 106 through the power supply line 98. A pulse signal from the previous stage (in the pulse signal output circuit 90 in the first stage, the pulse signal is a start pulse signal) is input to the gate terminal of the transistor 105. An output signal of the input signal generation circuit 202 is input to a gate terminal of the transistor 106. The gate terminal of the transistor 106 functions as a second input terminal of the input signal generation circuit 201. The second potential is supplied to a gate terminal of the transistor 107 through the power supply line 99.

Although the transistor 107 is provided in this embodiment, a configuration without the transistor 107 may be employed. With the transistor 107, the rise in the potential of the first terminal of the transistor 105, which might be caused by bootstrap operation, can be suppressed. That is to say, application of high voltage to a region between the gate and the source (or between the gate and the drain) of the transistor 105 can be prevented; thus, deterioration of the transistor 105 can be suppressed.

A specific example of a configuration of the input signal generation circuit 202 is as follows.

A second terminal of the transistor 110 and a first terminal of the transistor 108 are electrically connected to each other. The second terminal of the transistor 108, the second terminal of the transistor 111, and the first terminal of the transistor 109 are electrically connected to each other, and function as the output terminal of the input signal generation circuit 202.

The second potential is supplied to a first terminal of the transistor 111 and a first terminal of the transistor 110 through the power supply line 99. The first potential is supplied to a second terminal of the transistor 109 through the power supply line 98. A pulse signal from the stage following the next stage is input to a gate terminal of the transistor 111. The gate terminal of the transistor 111 functions as a first input terminal of the input signal generation circuit 202 and also as the input terminal 95 of the pulse signal output circuit. The second clock signal CLK2 is input to a gate terminal of the transistor 108. The gate terminal of the transistor 108 functions as a second input terminal of the input signal generation circuit 202 and also as the input terminal 92 of the pulse signal output circuit 90. A pulse signal from the previous stage (in the pulse signal output circuit 90 in the first stage, the pulse signal is a start pulse signal) is input to a gate terminal of the transistor 109. The gate terminal of the transistor 109 functions as a third input terminal of the input signal generation circuit 202 and also as the input terminal 94 of the pulse signal output circuit. The third clock signal CLK3 is input to a gate terminal of the transistor 110. The gate terminal of the transistor 110 functions as the fourth input terminal of the input signal generation circuit 202 and the input terminal 93 in the pulse signal output circuit 90.

Note that components of the pulse signal output circuit 90 (e.g., configuration examples of the pulse signal generation circuit 200, the input signal generation circuit 201, and the input signal generation circuit 202) are just examples, and the disclosed invention is not limited thereto.

In the following description of this embodiment, a node where the gate terminal of the transistor 101, the gate terminal of the transistor 103, and the output terminal of the input signal generation circuit 201 are connected to each other in the pulse signal output circuit 90 in FIG. 12C is referred to as the node A. In addition, a node where the gate terminal of the transistor 102, the gate terminal of the transistor 104, and the output terminal of the input signal generation circuit 202 are connected to each other is referred to as a node B.

A capacitor for favorably performing bootstrap operation may be provided between the node A and the output terminal 96. Furthermore, a capacitor electrically connected to the node B may be provided in order to hold the potential of the node B.

An oxide semiconductor containing a metal oxide is preferably used for the transistors 101 to 111. When an oxide semiconductor is included in the transistor, the off-state current of the transistor can be reduced. Furthermore, the on-state current and field-effect mobility can be increased as compared with those in the case where amorphous silicon or the like is used. Furthermore, the deterioration of the transistor can be prevented. Thus, an electronic circuit that consumes low power, can operate at high speed, and operates with higher accuracy is achieved.

At least part of this embodiment can be implemented in combination with any of the other embodiments described in this specification as appropriate.

Embodiment 3

In this embodiment, a display device that can be used for one embodiment of the present invention and a driving method thereof are described.

The display device of one embodiment of the present invention can include a pixel in which a first display element that reflects visible light is provided. Alternatively, the display device can include a pixel in which a second display element that emits visible light is provided. Alternatively, the display device can include a pixel in which a third display element that transmits visible light is provided. Alternatively, the display device can include a pixel in which the first display element and one of the second and third display elements are provided.

In this embodiment, a display device including a first display element that reflects visible light and a second display element that emits visible light is described.

The display device has a function of displaying an image utilizing one or both of first light reflected by the first display element and second light emitted from the second display element. Alternatively, the display device has a function of expressing gray scales by individually controlling the amount of first light reflected by the first display element and the amount of second light emitted from the second display element.

It is preferable that the display device have a structure including a first pixel expressing gray scales by controlling the amount of light reflected from the first display element and a second pixel expressing gray scales by controlling the amount of light emitted from the second display element. For example, the first pixels are arranged in a matrix and the second pixels are arranged in a matrix to form a display portion.

The number of the first pixels is preferably the same as that of the second pixels, and the first pixels and the second pixels are preferably arranged in a display region with the same pitch. Here, the first pixel and the second pixel adjacent to each other can be collectively referred to as a pixel unit. Accordingly, as described later, an image displayed by a plurality of first pixels, an image displayed by a plurality of second pixels, and an image displayed by both the plurality of first pixels and the plurality of second pixels can be displayed in the same display region.

As the first display element included in the first pixel, an element that performs display by reflecting external light can be used. Such an element does not include a light source and thus power consumption in display can be significantly reduced.

As the first display element, a reflective liquid crystal element can be typically used. As the first display element, other than a Micro Electro Mechanical Systems (MEMS) shutter element and an optical interference type MEMS element, an element using a microcapsule method, an electrophoretic method, an electrowetting method, an Electronic Liquid Powder (registered trademark) method, or the like can be used.

As the second display element included in the second pixel, an element including a light source and performing display using light from the light source can be used. Specifically, it is preferable to use an electroluminescence element in which light can be extracted from a light-emitting substance by application of an electric field. Since the luminance and the chromaticity of light emitted from such a pixel are not affected by external light, an image with high color reproducibility (a wide color gamut) and a high contrast, i.e., a clear image can be displayed.

As the second display element, a self-luminous light-emitting element such as an organic light-emitting diode (OLED), a light-emitting diode (LED), a quantum-dot light-emitting diode (QLED), and a semiconductor laser can be used. Alternatively, a combination of a backlight that is a light source and a transmissive liquid crystal element controlling the amount of light transmitted from the backlight may be used as the display element included in the second pixel.

The first pixel can include, for example, a subpixel exhibiting light of white (W), or subpixels exhibiting light of three colors of red (R), green (G), and blue (B), respectively. Similarly, the second pixel can include, for example, a subpixel exhibiting light of white (W), or subpixels exhibiting light of three colors of red (R), green (G), and blue (B), respectively. Note that the first pixel and the second pixel may each include subpixels of four colors or more. As the number of subpixels is increased, power consumption can be reduced and color reproducibility can be improved.

In one embodiment of the present invention, a first mode in which an image is displayed by the first pixels, a second mode in which an image is displayed by the second pixels, and a third mode in which an image is displayed by the first pixels and the second pixels can be switched.

The first mode is a mode in which an image is displayed utilizing light reflected from the first display element. In the first mode, a light source is not necessary and thus the first mode is a driving mode with extremely low power consumption. The first mode is effective in the case where, for example, external light has a sufficiently high illuminance and is white light or light near white light. The first mode is a display mode appropriate for displaying text data, such as that of a book or that of a document. Use of reflected light enables eye-friendly display, thereby mitigating eye fatigue.

The second mode is a mode in which an image is displayed utilizing light emitted from the second display element. Thus, an extremely clear image (high contrast and high color reproducibility) can be displayed regardless of the illuminance and chromaticity of external light. For example, the second mode is effective in the case where the illuminance of external light is extremely low, such as during the night or in a dark room. When a bright image is displayed under weak external light, a user may feel that the image is too bright. To prevent this, an image with reduced luminance is preferably displayed in the second mode. Thus, not only a reduction in the luminance but also low power consumption can be achieved. The second mode is a mode suitable for obtaining a clear image and a smooth moving image.

The third mode is a mode in which display is performed using both light reflected from the first display element and light emitted from the second display element. Specifically, the display device is driven so that light emitted from the first pixel and light emitted from the second pixel adjacent to the first pixel are mixed to express one color. Accordingly, a clearer image than that in the first mode can be displayed and power consumption can be made lower than that in the second mode. For example, the third mode is effective when the illuminance of external light is relatively low such as under indoor illumination or in the morning or evening, or when the external light does not represent a white chromaticity. Furthermore, the use of light obtained by mixing reflected light and emitted light makes it possible to display an image that gives a viewer the impression of seeing a picture.

A more specific example of one embodiment of the present invention is described below with reference to drawings.

[Structure Example of Display Device]

Figure 13A:
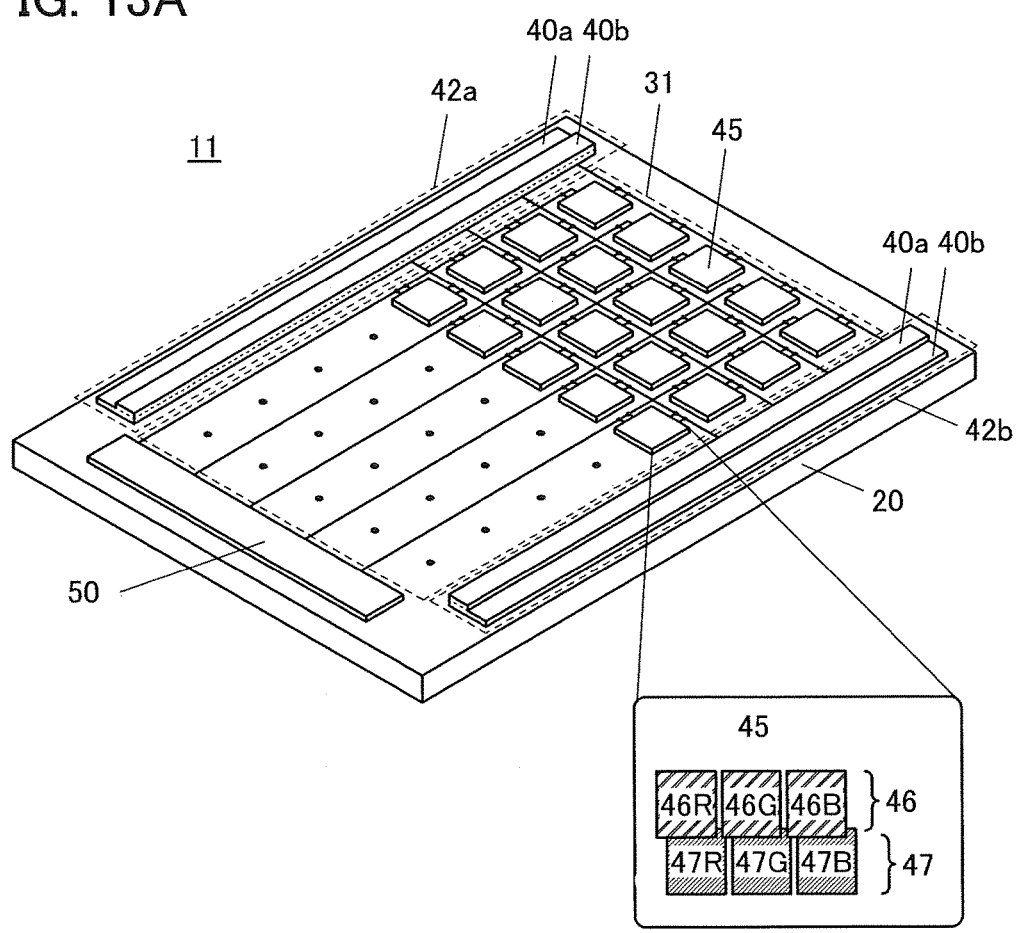
FIGS. 13A to 13C illustrate structures of a display device.

FIG. 13A illustrates a display device 11 of one embodiment of the present invention. The display device 11 includes the display portion 31, a driver circuit 42a, a driver circuit 42b, and the driver circuit 50. Moreover, the display device 11 may include a photometric portion for obtaining illuminance of external light and the like.

The display portion 31 includes a plurality of pixel units 45 arranged in a matrix. The pixel unit 45 includes a first pixel 46 and a second pixel 47.

FIG. 13A shows an example where the first pixel 46 and the second pixel 47 each include display elements corresponding to three colors of red (R), green (G), and blue (B).

The first pixel 46 includes a display element 46R corresponding to red (R), a display element 46G corresponding to green (G), and a display element 46B corresponding to blue (B). The display elements 46R, 46G, and 46B each utilize reflection of external light.

The second pixel 47 includes a display element 47R corresponding to red (R), a display element 47G corresponding to green (G), and a display element 47B corresponding to blue (B). The display elements 47R, 47G, and 47B each utilize light of a light source.

The driver circuits 42a, 42b and 50 include circuits for driving a plurality of pixel units 45 in the display portion 31. Specifically, a signal including a gray level, a scan signal, a power supply potential, and the like are supplied to the first pixel 46 and the second pixel 47 included in the pixel unit 45. The driver circuit 42a can be, for example, a gate driver for driving the first pixel 46. The driver circuit 42b can be, for example, a gate driver for selecting the second pixel 47. The driver circuit 50 can be, for example, a source driver for inputting a video signal to the selected first pixel 46 and the selected second pixel 47.

Note that, like the driver circuit 40 described in Embodiment 1, each of the driver circuits 42a and 42b includes a shift register circuit formed in the layer 40a and a buffer circuit formed in the layers 40a and 40b.

Figure 13B:
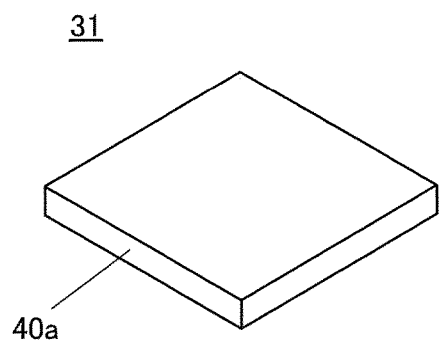
Figure 13C:
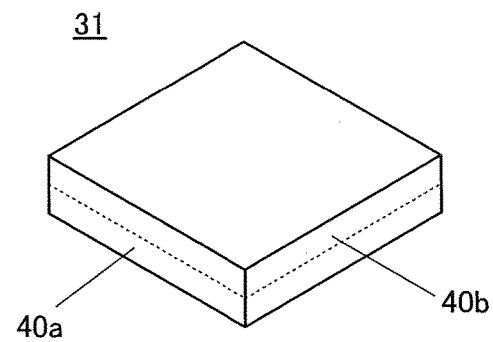

As illustrated in FIG. 13B, the pixel unit 45 can be provided in the layer 40a. Alternatively, as illustrated in FIG. 13C, the pixel unit 45 can be provided in the layers 40a and 40b. In the latter case, one of the first pixel 46 and the second pixel 47 can be provided in the layer 40a, and the other can be provided in the layer 40b. In that case, a transistor included in the first pixel 46 can be provided in the layer 40a or the layer 40b. Furthermore, a first transistor included in the second pixel 47 can be provided in the layer 40a, a second transistor included in the second pixel 47 can be provided in the layer 40b, and the second transistor can have a region overlapping with the first transistor. With such a structure, the area occupied by the transistors can be reduced, whereby the pixel density can be easily increased.

That is the description of the structure examples of the display device.

[Configuration Example of Pixel Unit]

Figure 14A:
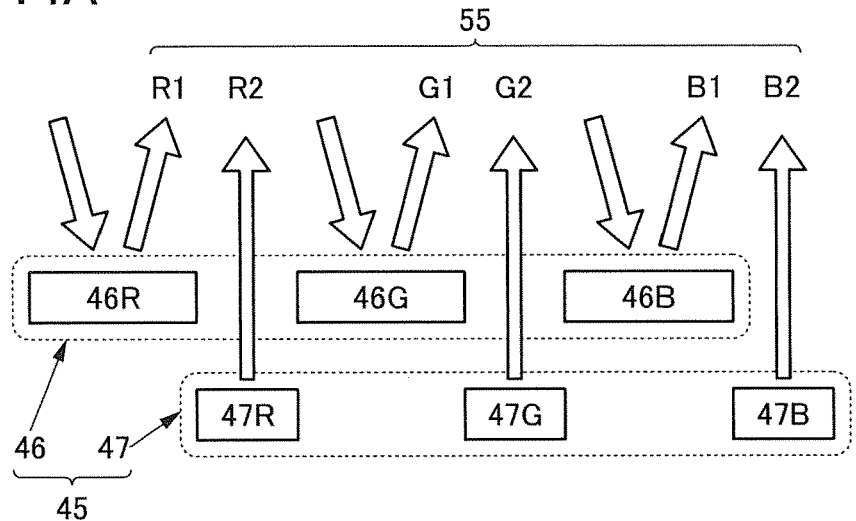
FIGS. 14A to 14C illustrate a pixel unit.
Figure 14B:
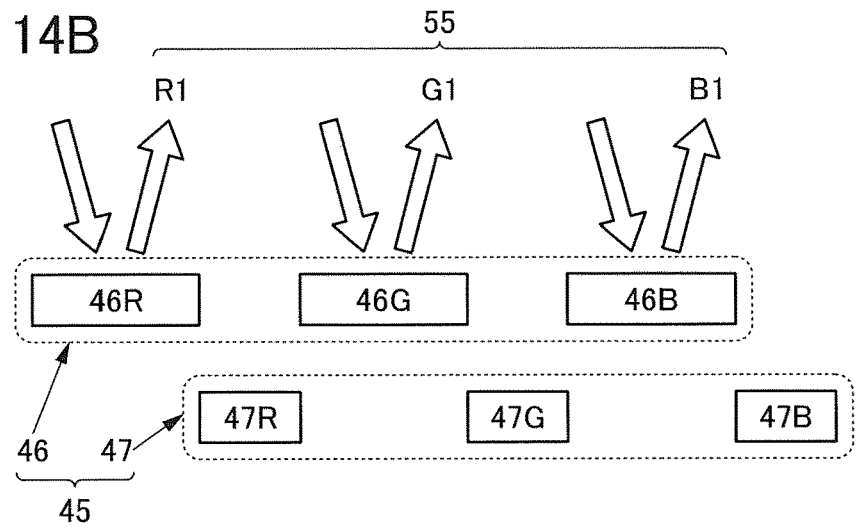
Figure 14C:
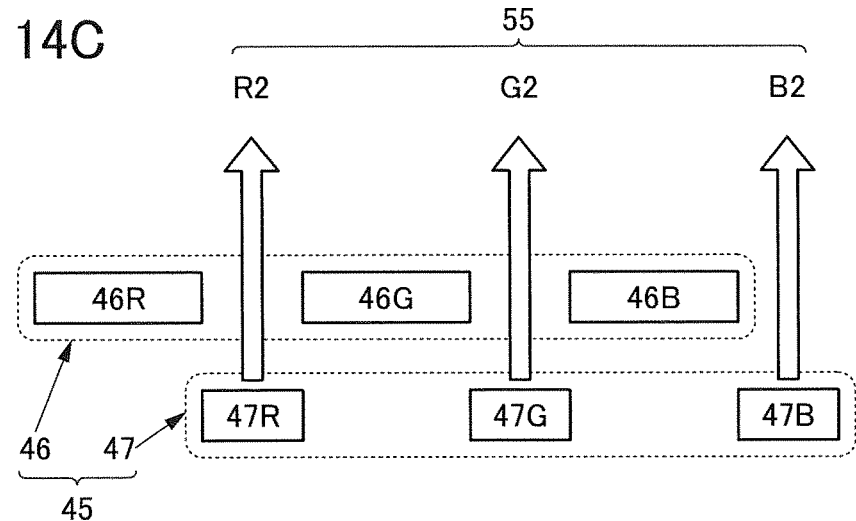

Next, the pixel unit 45 is explained with reference to FIGS. 14A to 14C. FIGS. 14A to 14C are schematic views illustrating structure examples of the pixel unit 45.

The first pixel 46 includes the display elements 46R, 46G, and 46B. The display element 46R reflects external light and emits, to the display surface side, red light R1 with a luminance corresponding to a gray level of red included in the first gray level input to the first pixel 46. Similarly, the display element 46G and the display element 46B emit green light G1 and blue light B1, respectively, to the display surface side.

The second pixel 47 includes the display elements 47R, 47G, and 47B. The display element 47R includes a light source and emits, to the display surface side, red light R2 with a luminance corresponding to a gray level of red included in the second gray level input to the second pixel 47. Similarly, the display element 47G and the display element 47B emit green light G2 and blue light B2, respectively, to the display surface side.

[Third Mode]

FIG. 14A shows an example of an operation mode in which an image is displayed by driving both the display element reflecting external light (the display elements 46R, 46G, and 46B) and the display element emitting light (the display elements 47R, 47G, and 47B). As illustrated in FIG. 14A, the pixel unit 45 can emit light 55 of a predetermined color to the display surface side by mixing light of six colors, the light R1, the light G1, the light B1, the light R2, the light G2, and the light B2.

At that time, the luminance of each of the display elements 47R, 47G, and 47B is preferably low. For example, when the maximum value of luminance of light emitted by each of the display elements 47R, 47G, and 47B is referred to as highest luminance, the maximum value of luminance of light emitted by each of the display elements 47R, 47G, and 47B in the third mode is preferably greater than or equal to 5% and less than or equal to 50%, further preferably greater than or equal to 1% and less than or equal to 60% of the highest luminance. Accordingly, an image can be displayed with low power consumption, the displayed image can become more like a painting, and display can be easy on eyes.

[First Mode]

FIG. 14B shows an example of an operation mode in which an image is displayed by driving the display elements 46R, 46G, and 46B that reflect external light. As illustrated in FIG. 14B, in the case where the illuminance of external light is sufficiently high, for example, the pixel unit 45 can emit the light 55 of a predetermined color by mixing only light from the first pixel 46 (the light R1, the light G1, and the light B1) without driving the second pixel 47. Thus, driving with extremely low power consumption can be performed.

[Second Mode]

FIG. 14C shows an example of an operation mode in which an image is displayed by driving the display elements 47R, 47G, and 47B. As illustrated in FIG. 14C, in the case where the illuminance of external light is extremely low, for example, the pixel unit 45 can emit the light 55 of a predetermined color by mixing only light from the second pixel 47 (the light R2, the light G2, and the light B2) without driving the first pixel 46. Accordingly, a clear image can be displayed. Furthermore, luminance is lowered when the illuminance of external light is low, which can prevent a user from feeling glare and reduce power consumption.

In this mode, the luminance of the display elements that emit visible light is preferably higher than that in the third mode. For example, the maximum value of luminance of light emitted by each of the display elements 47R, 47G, and 47B in the second mode can be 100% of the highest luminance, or greater than or equal to 50% and less than or equal to 100%, preferably greater than or equal to 60% and less than or equal to 100% of the highest luminance. Accordingly, a clear image can be displayed even at a bright place with external light.

Here, each of the maximum values of luminance of light emitted from the display elements 47R, 47G, and 47B can be regarded as a dynamic range. That is, the dynamic range of each of the display elements 47R, 47G, and 47B in the third mode can be set narrower than that in the second mode. For example, the dynamic range of each of the display elements 47R, 47G, and 47B in the third mode is set to be greater than or equal to 5% and less than or equal to 50%, preferably greater than or equal to 1% and less than or equal to 60% of the dynamic range of the second mode.

The above is the description of the configuration example of the pixel unit 45.

At least part of this embodiment can be implemented in combination with any of the other embodiments described in this specification as appropriate.

Embodiment 4

An example of a display panel that can be used for the display device of one embodiment of the present invention is described below. The display panel described below as an example includes both a reflective liquid crystal element and a light-emitting element and can display an image both in a transmissive mode and in a reflective mode.

[Structure Example]

Figure 15A:
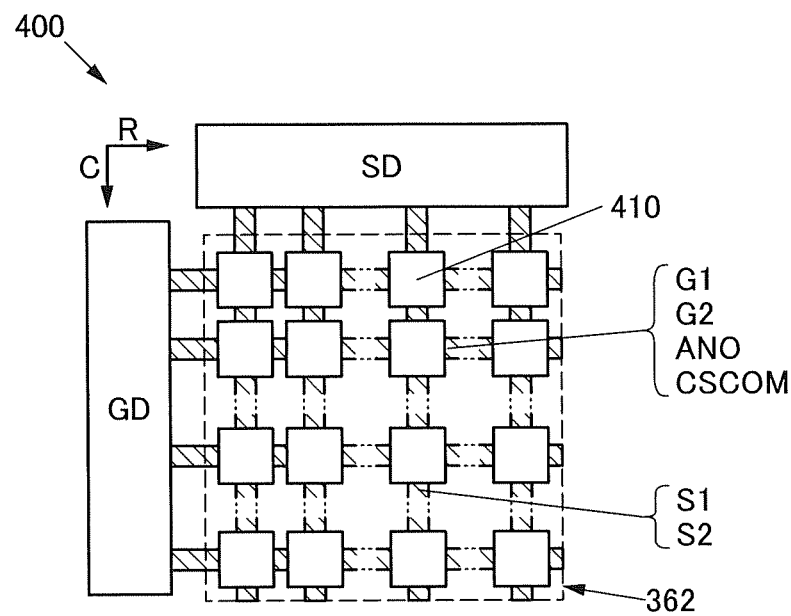
Figure 15A:
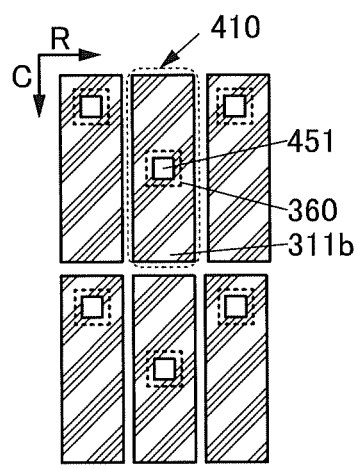
Figure 15A:
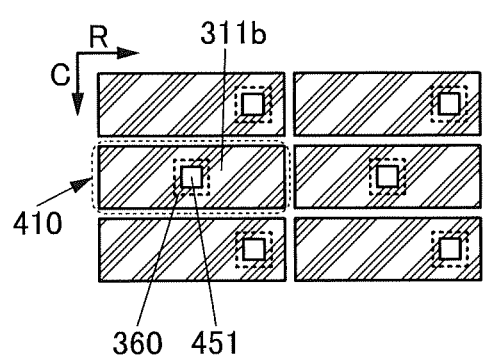

FIG. 15A is a block diagram illustrating an example of the structure of a display device 400. The display device 400 includes a plurality of pixels 410 that are arranged in a matrix in a display portion 362. The display device 400 also includes a circuit GD and a circuit SD. In addition, the display device 400 includes a plurality of wirings G1, a plurality of wirings G2, a plurality of wirings ANO, and a plurality of wirings CSCOM, which are electrically connected to the circuit GD and the plurality of pixels 410 arranged in a direction R. Moreover, the display device 400 includes the plurality of pixels 410 arranged in a direction C, and a plurality of wirings S1 and a plurality of wirings S2 that are electrically connected to the circuit SD.

Although the display device includes one circuit GD and one circuit SD here for simplification, the circuit GD and the circuit SD for driving a liquid crystal element and the circuit GD and the circuit SD for driving a light-emitting element may be provided separately.

The pixel 410 includes a reflective liquid crystal element and a light-emitting element. In the pixel 410, the liquid crystal element and the light emitting element partly overlap with each other.

FIG. 15B1 illustrates a structure example of a conductive layer 311$b$ included in the pixel 410. The conductive layer 311$b$ serves as a reflective electrode of the liquid crystal element in the pixel 410. The conductive layer 311$b$ has an opening 451.

In FIG. 15B1, a light-emitting element 360 in a region overlapping with the conductive layer 311$b$ is denoted by a dashed line. The light-emitting element 360 overlaps with the opening 451 included in the conductive layer 311$b$. Thus, light from the light-emitting element 360 is emitted to a display surface side through the opening 451.

In FIG. 15B1, the pixels 410 adjacent in the direction R correspond to different colors. As illustrated in FIG. 15B1, the openings 451 are preferably provided in different positions in the conductive layers 311$b$ so as not to be aligned in the two pixels adjacent to each other in the direction R. This allows the two light-emitting elements 360 to be apart from each other, thereby preventing light emitted from the light-emitting element 360 from entering a coloring layer in the adjacent pixel 410 (such a phenomenon is also referred to as crosstalk). Furthermore, since the two adjacent light-emitting elements 360 can be arranged apart from each other, a high-resolution display device is achieved even when EL layers of the light-emitting elements 360 are separately formed with a blocking mask or the like.

Alternatively, arrangement illustrated in FIG. 15B2 may be employed.

If the ratio of the total area of the opening 451 to the total area except for the opening is too large, display performed using the liquid crystal element is dark. If the ratio of the total area of the opening 451 to the total area except for the opening is too small, display performed using the light-emitting element 360 is dark.

If the area of the opening 451 in the conductive layer 311$b$ serving as a reflective electrode is too small, light emitted from the light-emitting element 360 is not efficiently extracted.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

[Circuit Configuration Example]

Figure 16:
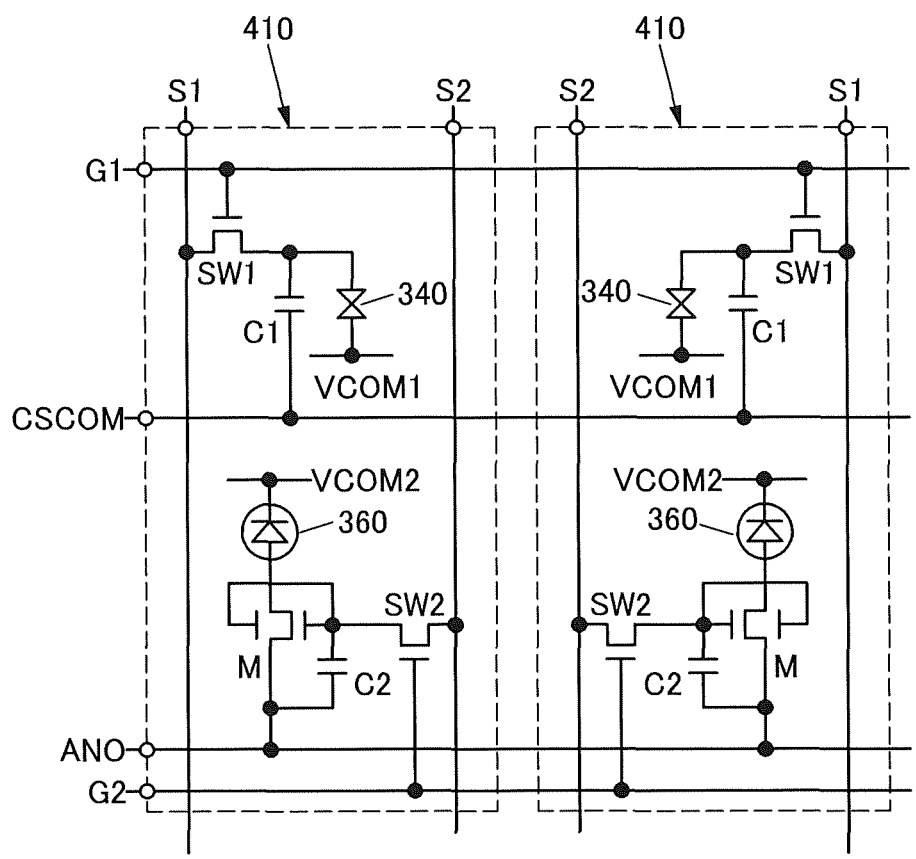
FIG. 16 illustrates a pixel circuit.

FIG. 16 is a circuit diagram illustrating a structure example of the pixel 410. FIG. 16 shows two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 16 illustrates a wiring VCOM1 electrically connected to the liquid crystal element 340 and a wiring VCOM2 electrically connected to the light-emitting element 360.

FIG. 16 illustrates an example in which a transistor is used as each of the switches SW1 and SW2.

A gate of the switch SW1 is connected to the wiring G1. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other of the source and the drain is connected to one electrode of the capacitor C2 and a gate of the transistor M. The other electrode of the capacitor C2 is connected to one of a source and a drain of the transistor M and the wiring ANO. The other of the source and the drain of the transistor M is connected to one electrode of the light-emitting element 360. The other electrode of the light-emitting element 360 is connected to the wiring VCOM2.

FIG. 16 illustrates an example in which the transistor M includes two gates between which a semiconductor is provided and which are connected to each other. This structure can increase the amount of current flowing through the transistor M.

The wiring G1 can be supplied with a signal for changing the on/off state of the transistor SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 16, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals to the wiring G1, the wiring G2, the wiring S1, and the wiring S2.

Figure 17A:
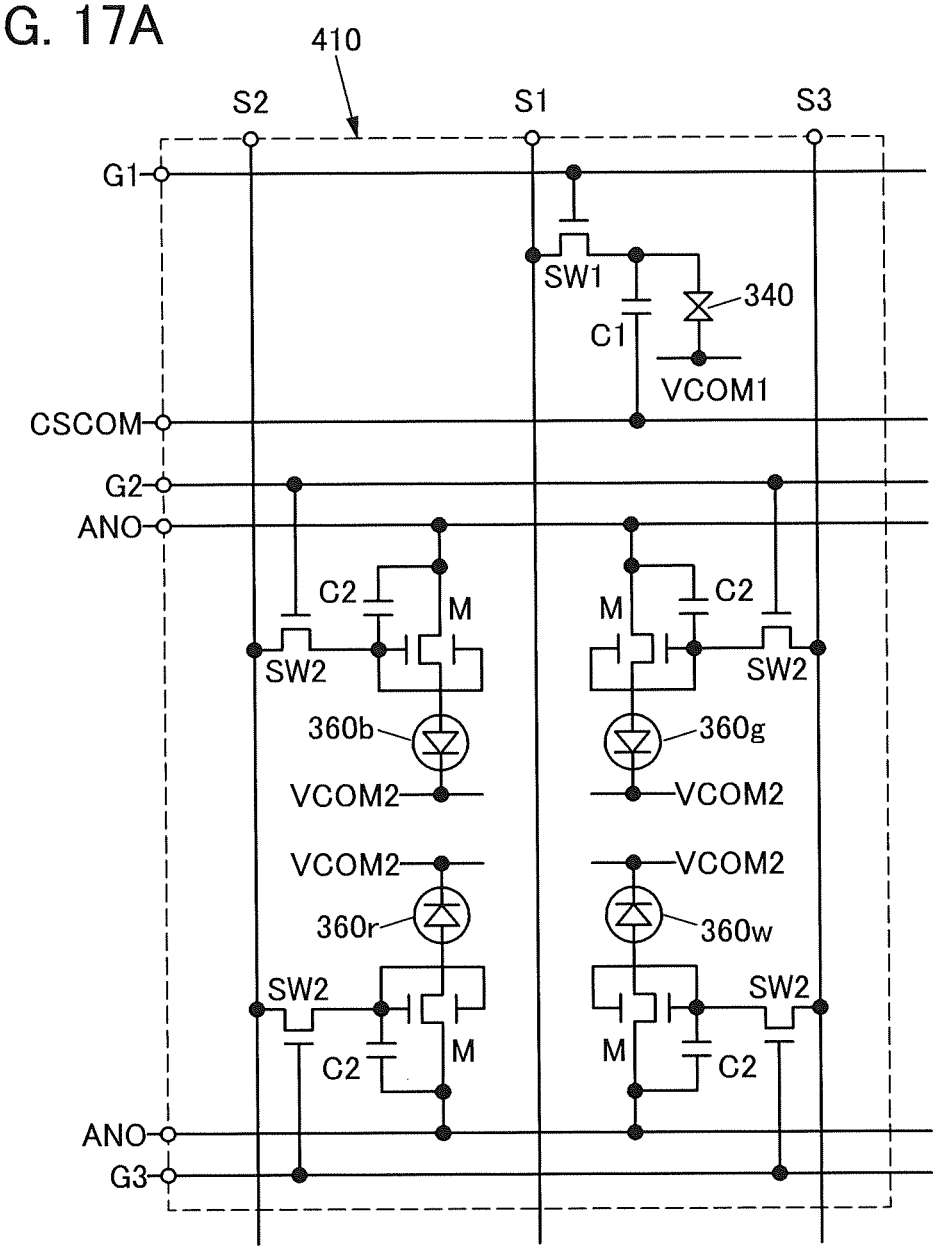
FIGS. 17A and 17B are a diagram illustrating a pixel circuit and a top view of a pixel.

Although FIG. 16 illustrates an example in which one liquid crystal element 340 and one light-emitting element 360 are provided in one pixel 410, one embodiment of the present invention is not limited thereto. FIG. 17A illustrates an example in which one liquid crystal element 340 and four light-emitting elements 360 (light-emitting elements 360r, 360g, 360b, and 360w) are provided in one pixel 410.

In FIG. 17A, in addition to the example in FIG. 16, a wiring G3 and a wiring S3 are connected to the pixel 410.

In the example in FIG. 17A, light-emitting elements emitting red light (R), green light (B), blue light (B), and white light (W) can be used for the four light-emitting elements 360, for example. Furthermore, as the liquid crystal element 340, a reflective liquid crystal element emitting white light can be used. Thus, in the case of performing display in the reflective mode, white display with high reflectivity can be performed. In the case of performing display in the transmissive mode, images can be displayed with a higher color rendering property at low power consumption.

Figure 17B:
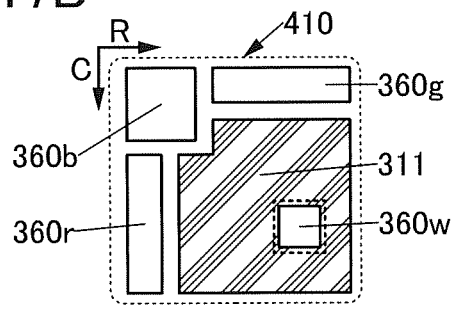

FIG. 17B illustrates a structural example of the pixel 410. The pixel 410 includes the light-emitting element 360w overlapping with the opening of an electrode 311 and the light-emitting element 360r, the light-emitting element 360g, and the light-emitting element 360b that are arranged in the periphery of the electrode 311. It is preferable that the light-emitting elements 360r, 360g, and 360b have almost the same light-emitting area.

[Structure Example of Display Panel]

Figure 18:
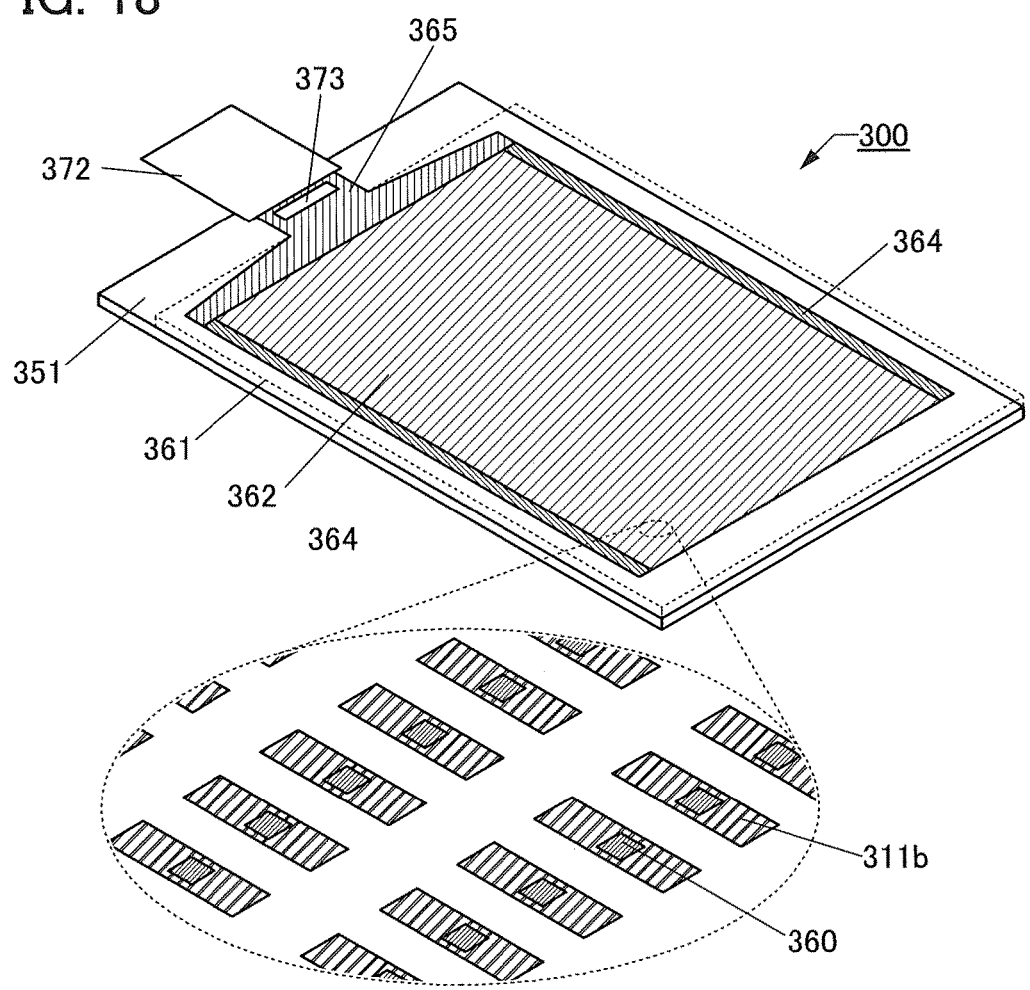
FIG. 18 shows a structure of a display device.

FIG. 18 is a schematic perspective view illustrating a display panel 300 of one embodiment of the present invention. In the display panel 300, a substrate 351 and a substrate 361 are attached to each other. In FIG. 18, the substrate 361 is denoted by a dashed line.

A display panel 300 includes the display portion 362, a circuit 364, a wiring 365, and the like. The substrate 351 is provided with the circuit 364, the wiring 365, a conductive layer 311b that serves as a pixel electrode, and the like. In FIG. 18, an IC 373 and an FPC 372 are mounted on the substrate 351. Thus, the structure illustrated in FIG. 18 can be referred to as a display module including the display panel 300, the FPC 372, and the IC 373.

As the circuit 364, for example, a circuit functioning as a scan line driver circuit can be used.

The wiring 365 has a function of supplying a signal or electric power to the display portion 362 or the circuit 364. The signal or electric power is input to the wiring 365 from the outside through the FPC 372 or from the IC 373.

FIG. 18 shows an example in which the IC 373 is provided on the substrate 351 by a chip on glass (COG) method or the like. As the IC 373, an IC functioning as a scan line driver circuit, a signal line driver circuit, or the like can be used. Note that it is possible that the IC 373 is not provided when, for example, the display panel 300 includes circuits serving as a scan line driver circuit and a signal line driver circuit and when the circuits serving as a scan line driver circuit and a signal line driver circuit are provided outside and a signal for driving the display panel 300 is input through the FPC 372. Alternatively, the IC 373 may be mounted on the FPC 372 by a chip on film (COF) method or the like.

FIG. 18 also shows an enlarged view of part of the display portion 362. The conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 18, the conductive layer 311b has an opening. The light-emitting element 360 is provided on the substrate 351 side of the conductive layer 311b. Light is emitted from the light-emitting element 360 to the substrate 361 side through the opening in the conductive layer 311b.

[Cross-Sectional Structure Example]

Figure 19:
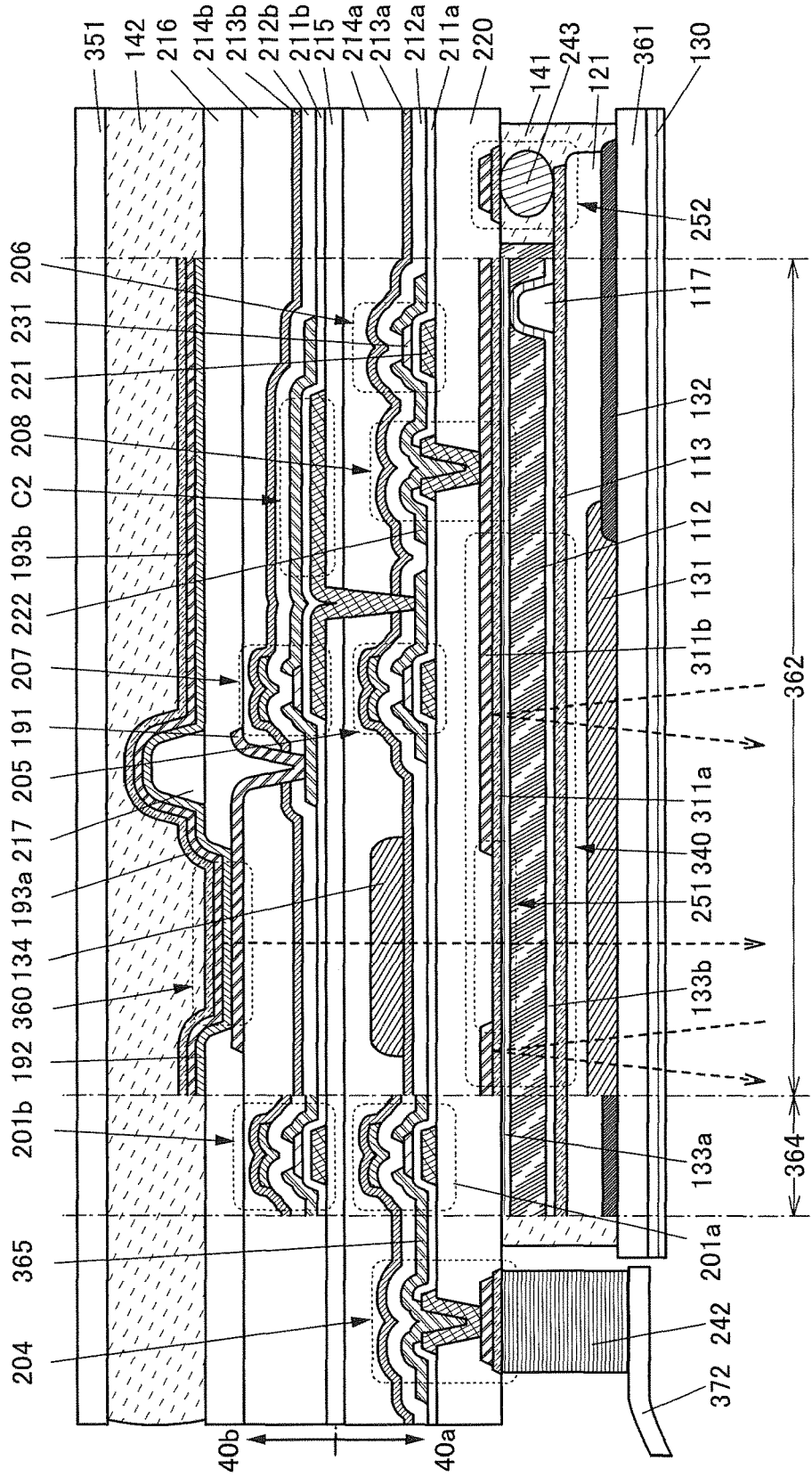
FIG. 19 is a cross-sectional view illustrating a display device.

FIG. 19 shows an example of cross sections of part of a region including the FPC 372, part of a region including the circuit 364, and part of a region including the display portion 362 of the display panel illustrated in FIG. 18.

The display panel includes an insulating layer 220 between the substrates 351 and 361. The display panel also includes the light-emitting element 360, a transistor 201a, a transistor 201b, a transistor 205, a transistor 206, a transistor 207, a coloring layer 134, and the like between the substrate 351 and the insulating layer 220. Furthermore, the display panel includes the liquid crystal element 340, a coloring layer 131, and the like between the insulating layer 220 and the substrate 361. The substrate 361 and the insulating layer 220 are bonded with an adhesive layer 141. The substrate 351 and the insulating layer 220 are bonded with an adhesive layer 142.

The transistor 206 is electrically connected to the liquid crystal element 340. The transistor 205 is electrically connected to the transistor 207. The transistor 207 is electrically connected to the light-emitting element 360. Since the transistors 205 and 206 are formed on a surface of the insulating layer 220 that is on the substrate 351 side, the transistors 205 and 206 can be formed through the same process. Furthermore, since the transistor 207 is formed to overlap with the transistor 205, the pixel size can be reduced. Note that the capacitor C2 can be formed using a layer extending from a gate electrode of the transistor 207, a layer extending from a gate insulating film of the transistor 207, and a layer extending from one of a source electrode and a drain electrode of the transistor 207.

The coloring layer 131, a light-blocking layer 132, an insulating layer 121, a conductive layer 113 serving as a common electrode of the liquid crystal element 340, an alignment film 133b, an insulating layer 117, and the like are provided over the substrate 361. The insulating layer 117 serves as a spacer for holding a cell gap of the liquid crystal element 340.

Insulating layers such as an insulating layer 211a, an insulating layer 212a, an insulating layer 213a, an insulating layer 214a, an insulating layer 215, an insulating layer 211b, an insulating layer 212b, an insulating layer 213b, an insulating layer 214b, and an insulating layer 216 are provided over the substrate 351 side of the insulating layer 220.

Part of the insulating layer 211a functions as gate insulating layers of the transistors 205 and 206. The insulating layer 212a, the insulating layer 213a, and the insulating layer 214a are provided to cover the transistors 205 and 206.

Part of the insulating layer 211b functions as a gate insulating layer of the transistor 207. The insulating layer 212b, the insulating layer 213b, and the insulating layer 214b are provided to cover the transistor 207.

The insulating layers 214a and 214b each function as a planarization layer. Note that an example where the three insulating layers are provided to cover the transistors and the like is described here; however, one embodiment of the present invention is not limited to this example, and four or more insulating layers, a single insulating layer, or two insulating layers may be provided. The insulating layer 214a and 214b serving as planarization layers are not necessarily provided. Furthermore, an example where the insulating layer 215 is provided between the insulating layers 214a and 211b is described here; however, the insulating layer 215 is not necessarily provided.

The transistors 205, 206, and 207 each include a conductive layer 221 part of which functions as a gate, conductive layers 222 part of which functions as a source and a drain, and a semiconductor layer 231.

The liquid crystal element 340 is a reflective liquid crystal element. The liquid crystal element 340 has a structure in which a conductive layer 311a, a liquid crystal 112, and the conductive layer 113 are stacked. A conductive layer 311b that reflects visible light is provided in contact with the substrate 351 side of the conductive layer 311a. The conductive layer 311b includes an opening 251. The conductive layers 311a and 113 contain a material transmitting visible light. In addition, an alignment film 133a is provided between the liquid crystal 112 and the conductive layer 311a and the alignment film 133b is provided between the liquid crystal 112 and the conductive layer 113. A polarizing plate 130 is provided on an outer surface of the substrate 361.

In the liquid crystal element 340, the conductive layer 311b has a function of reflecting visible light, and the conductive layer 113 has a function of transmitting visible light. Light entering from the substrate 361 side is polarized by the polarizing plate 130, passes through the conductive layer 113 and the liquid crystal 112, and is reflected by the conductive layer 311b. Then, the light passes through the liquid crystal 112 and the conductive layer 113 again and reaches the polarizing plate 130. In this case, alignment of the liquid crystal 112 is controlled with a voltage that is applied between the conductive layer 311b and the conductive layer 113, and thus optical modulation of light can be controlled. That is, the intensity of light emitted through the polarizing plate 130 can be controlled. Light other than one in a particular wavelength region of the light is absorbed by the coloring layer 131, and thus, emitted light is red light, for example.

The light-emitting element 360 is a bottom-emission light-emitting element. The light-emitting element 360 has a structure in which a conductive layer 191, an EL layer 192, and a conductive layer 193b are stacked in this order from the insulating layer 220 side. In addition, a conductive layer 193a is provided to cover the conductive layer 193b. The conductive layer 193b contains a material reflecting visible light, and the conductive layers 191 and 193a contain a material transmitting visible light. Light is emitted from the light-emitting element 360 to the substrate 361 side through the coloring layer 134, the insulating layer 220, the opening 251, the conductive layer 113, and the like.

Here, as illustrated in FIG. 19, the conductive layer 311a transmitting visible light is preferably provided for the opening 251. Accordingly, the liquid crystal 112 is aligned in a region overlapping with the opening 251 as well as in the other regions, in which case an alignment defect of the liquid crystal is prevented from being generated in the boundary portion of these regions and undesired light leakage can be suppressed.

As the polarizing plate 130 provided on an outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 340 are controlled depending on the kind of the polarizing plate so that desirable contrast is obtained.

An insulating layer 217 is provided on the insulating layer 216 covering an end portion of the conductive layer 191. The insulating layer 217 has a function as a spacer for preventing the insulating layer 220 and the substrate 351 from getting closer more than necessary. In addition, in the case where the EL layer 192 or the conductive layer 193a is formed using a blocking mask (metal mask), the insulating layer 217 may have a function of preventing the blocking mask from being in contact with a surface on which the EL layer 192 or the conductive layer 193a is formed. Note that the insulating layer 217 is not necessarily provided.

One of a source and a drain of the transistor 207 is electrically connected to the EL layer 192 of the light-emitting element 360 through the conductive layer 191.

One of a source and a drain of the transistor 206 is electrically connected to the conductive layer 311b through a connection portion 208. The conductive layers 311b and 311a are in contact with and electrically connected to each other. Here, in the connection portion 208, the conductive layers provided on both surfaces of the insulating layer 220 are connected to each other through openings in the insulating layer 220.

A connection portion 204 is provided in a region of the substrate 351 that does not overlap with the substrate 361. The connection portion 204 has a structure similar to that of the connection portion 208. On the top surface of the connection portion 204, a conductive layer obtained by processing the same conductive film as the conductive layer 311a is exposed. Thus, the connection portion 204 and the FPC 372 can be electrically connected to each other through a connection layer 242.

A connection portion 252 is provided in part of a region where the adhesive layer 141 is provided. In the connection portion 252, the conductive layer obtained by processing the same conductive film as the conductive layer 311a is electrically connected to part of the conductive layer 113 with a connector 243. Accordingly, a signal or a potential input from the FPC 372 connected to the substrate 351 side can be supplied to the conductive layer 113 formed on the substrate 361 side through the connection portion 252.

As the connector 243, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 243, a material capable of elastic deformation or plastic deformation is preferably used. As illustrated in FIG. 19, the connector 243 that is the conductive particle has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connector 243 is dispersed in the adhesive layer 141 before curing of the adhesive layer 141.

FIG. 19 illustrates an example of the circuit 364 in which the transistors 201a and 201b are provided. For example, the transistor 201a corresponds to the transistor 71a included in the buffer circuit 70 described in Embodiment 1. Moreover, the transistor 201b corresponds to the transistor 71b included in the buffer circuit 70 described in Embodiment 1.

The transistor 201a can be formed through the same process as the transistors 205 and 206. The transistor 201b can be formed through the same process as the transistor 207.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material through which impurities such as water or hydrogen do not easily diffuse is preferably used for at least one of an insulating layer 212 and an insulating layer 213 that cover the transistors. That is, the insulating layer 212 or the insulating layer 213 can function as a barrier film. Such a structure can effectively suppress diffusion of the impurities into the transistors from the outside, and a highly reliable display panel can be provided.

The insulating layer 121 is provided on the substrate 361 side to cover the coloring layer 131 and the light-blocking layer 132. The insulating layer 121 may have a function of a planarization layer. The insulating layer 121 enables the conductive layer 113 to have an almost flat surface, resulting in a uniform alignment state of the liquid crystal 112.

[Components]

The above components are described below.

[Substrate]

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be decreased by using a thin substrate. A flexible display panel can be obtained by using a substrate that is thin enough to have flexibility.

Since the substrate through which light emission is not extracted does not need to have a light-transmitting property, a metal substrate or the like can be used in addition to the above-mentioned substrates. A metal material, which has high thermal conductivity, is preferable because it can easily conduct heat to the whole substrate and accordingly can prevent a local temperature rise in the display panel. To obtain flexibility and bendability, the thickness of a metal substrate is preferably greater than or equal to 10 µm and less than or equal to 200 µm, further preferably greater than or equal to 20 µm and less than or equal to 50 µm.

Although there is no particular limitation on a material of a metal substrate, it is favorable to use, for example, a metal such as aluminum, copper, and nickel, an aluminum alloy, or an alloy such as stainless steel.

It is preferable to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of the material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). It is particularly preferable to use a material with a low thermal expansion coefficient, for example, a material with a thermal expansion coefficient lower than or equal to $30\times10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. When a glass layer is used, a barrier property against water and oxygen can be improved and thus a highly reliable display panel can be provided.

[Transistor]

The transistor includes a conductive layer serving as a gate electrode, a semiconductor layer, a conductive layer serving as a source electrode, a conductive layer serving as a drain electrode, and an insulating layer serving as a gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

A transistor with an oxide semiconductor having a larger band gap and a lower carrier density than silicon has a low off-state current and therefore can hold charges stored in a capacitor that is series-connected to the transistor for a long time.

The semiconductor layer can be, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer contains an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable because the number of manufacturing steps can be reduced. When an oxide semiconductor, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

An oxide semiconductor film with low carrier density is used as the semiconductor layer. For example, the semiconductor layer is an oxide semiconductor film whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the oxide semiconductor contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. Thus, a transistor including an oxide semiconductor that contains nitrogen is likely to be normally on. Hence, the concentration of nitrogen that is measured by secondary ion mass spectrometry is preferably set to lower than or equal to $5\times10^{18}$ atoms/$cm^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor) including a c-axis aligned crystal, a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film has, for example, a single-layer structure or a stacked-layer structure including two or more of the above-described regions in some cases.

<Composition of CAC-OS>

Described below is the composition of a cloud-aligned composite oxide semiconductor (CAC-OS) applicable to a transistor disclosed in one embodiment of the present invention.

The CAC-OS refers to, for example, a composition of a material in which elements included in an oxide semiconductor are unevenly distributed. The material including unevenly distributed elements has a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ fouling the mosaic pattern is evenly distributed in the film. This composition is also referred to as a cloud-like composition.

That is, the CAC-OS is a composite oxide semiconductor with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected element(s) as a main component(s) are observed in part of the CAC-OS and nanoparticle regions including In as a main component are observed in part of the CAC-OS, and these nanoparticle regions are randomly dispersed to form a mosaic pattern in the CAC-OS.

The CAC-OS can be formed by a sputtering method under a condition where a substrate is not heated intentionally. In the case where the CAC-OS is formed by a sputtering method, one or more of an inert gas (typically, argon), an oxygen gas, and a nitrogen gas is used as a deposition gas. Furthermore, the flow rate of the oxygen gas to the total flow rate of the deposition gas in deposition is preferably as low as possible, for example, the flow rate of the oxygen gas is higher than equal to 0% and lower than 30%, preferably higher than equal to 0% and lower than 10%.

The CAC-OS has a characteristic in that a clear peak is not observed when measurement is conducted using a $\theta/2\theta$ scan by an out-of-plane method with an X-ray diffraction (XRD). That is, it is found that there are no alignment in the a-b plane direction and no alignment in the c-axis alignment in the measured areas by the XRD.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Thus, it is found from the electron diffraction pattern that the crystal structure of the CAC-OS includes a nanocrystalline (nc) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the regions including $GaO_{X3}$ as a main component and the regions including $In_{x2}Zn_{y2}O_{z2}$ or $InO_{x1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{x3}$ or the like as a main component and regions including $In_{x2}Zn_{y2}O_{z2}$ or $InO_{x1}$ as a main component are separated to form a mosaic pattern.

The conductivity of a region including $In_{x2}Zn_{y2}O_{z2}$ or $InO_{x1}$ as a main component is higher than that of a region including $GaO_{x3}$ or the like as a main component. In other words, when carriers flow through regions including $In_{x2}Zn_{y2}O_{z2}$ or $InO_{x1}$ as a main component, the conductivity of an oxide semiconductor is generated. Accordingly, when regions including $I_{x2}Zn_{y2}O_{z2}$ or $InO_{x1}$ as a main component are distributed in an oxide semiconductor like a cloud, high field-effect mobility (μ) can be achieved.

In contrast, the insulating property of a region including $GaO_{x3}$ or the like as a main component is higher than that of a region including $In_{x2}Zn_{y2}O_{z2}$ or $InO_{x1}$ as a main component. In other words, when regions including $GaO_{x3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{x3}$ or the like and the conductivity derived from $In_{x2}Zn_{y2}O_{z2}$ or $InO_{x1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Alternatively, silicon may be used as a semiconductor in which a channel of a transistor is formed. Although amorphous silicon may be used as silicon, silicon having crystallinity is particularly preferable. For example, microcrystalline silicon, polycrystalline silicon, single crystal silicon, or the like is preferably used. In particular, polycrystalline silicon can be formed at a lower temperature than single crystal silicon and has higher field effect mobility and higher reliability than amorphous silicon.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single crystal silicon, or the like is particularly preferable.

[Conductive Layer]

As materials for a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because the controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element, preventing a decrease in the reliability of the device.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like may be used.

For example, the water vapor transmittance of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], and still further preferably lower than or equal to $1\times10^{-8}$ [g/(m$^2$·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, or an antiferroelectric liquid crystal (AFLC) mode can be used.

The liquid crystal element controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

The liquid crystal element may be a transmissive liquid crystal element, a reflective liquid crystal element, a semi-transmissive liquid crystal element, or the like.

In one embodiment of the present invention, in particular, the reflective liquid crystal element can be used.

In the case where a transmissive or semi-transmissive liquid crystal element is used, two polarizing plates are provided such that a pair of substrates are sandwiched therebetween. Furthermore, a backlight is provided outside one of the polarizing plates. The backlight may be a direct-below backlight or an edge-light backlight. The direct-below backlight including a light-emitting diode (LED) is preferably used because local dimming is easily performed to improve contrast. The edge-light type backlight is preferably used because the thickness of a module including the backlight can be reduced.

In the case where a reflective liquid crystal element is used, a polarizing plate is provided on a display surface. In addition, a light diffusion plate is preferably provided on the display surface to improve visibility.

In the case where the reflective or the semi-transmissive liquid crystal element is used, a front light may be provided outside the polarizing plate. As the front light, an edge-light front light is preferably used. A front light including a light-emitting diode (LED) is preferably used to reduce power consumption.

[Light-Emitting Element]

As the light-emitting element, a self-luminous element can be used, and an element whose luminance is controlled by current or voltage is included in the category of the light-emitting element. For example, an LED, an organic EL element, an inorganic EL element, or the like can be used.

The light-emitting element has a top emission structure, a bottom emission structure, a dual emission structure, or the like. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in a yellow wavelength range preferably includes spectral components also in green and red wavelength ranges.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or the phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layers. For example, a stacked film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives such as a reactive curable adhesive, a thermosetting adhesive, an anaerobic adhesive, and a photocuring adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs water by chemical adsorption, such as oxide of an alkaline earth metal (e.g., calcium oxide or barium oxide), can be used. Alternatively, a substance that adsorbs water by physical adsorption, such as zeolite or silica gel, may be used. The drying agent is preferably included because it can prevent impurities such as water from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer that transmits light of a certain color and a film containing a material of a coloring layer that transmits light of another color can be employed. It is preferable that the coloring layer and the light-blocking layer be formed using the same material because the same manufacturing apparatus can be used and the process can be simplified.

At least part of this embodiment can be implemented in combination with any of the other embodiments described in this specification as appropriate.

Embodiment 5

Examples of an electronic device that can use the display device of one embodiment of the present invention include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. Specific examples of these electronic devices are illustrated in FIGS. 20A to 20F.

Figure 20A:
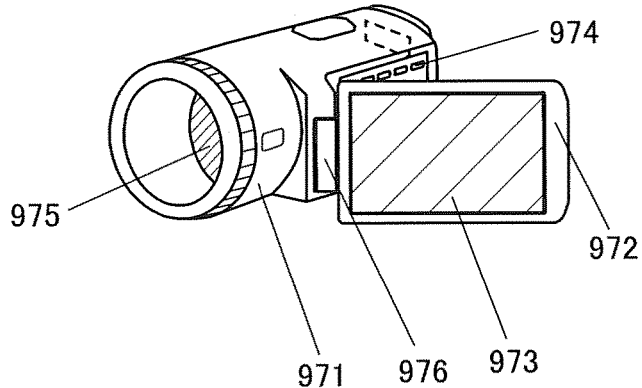
FIGS. 20A to 20F illustrate electronic devices.

FIG. 20A illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The display portion 973 of the video camera includes the display device of one embodiment of the present invention, so that outdoor visibility can be improved and low power consumption can be achieved.

Figure 20B:
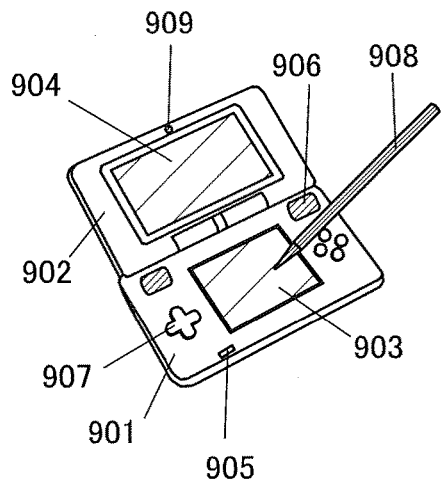

FIG. 20B illustrates a portable game machine, which includes housings 901 and 902, display portions 903 and 904, a microphone 905, speakers 906, an operation key 907, a stylus 908, a camera 909, and the like. Although the portable game console in FIG. 20B has the two display portions 903 and 904, the number of display portions included in a portable game console is not limited to this. The display portion 903 of the portable game machine includes the display device of one embodiment of the present invention, so that outdoor visibility can be improved and low power consumption can be realized.

Figure 20C:
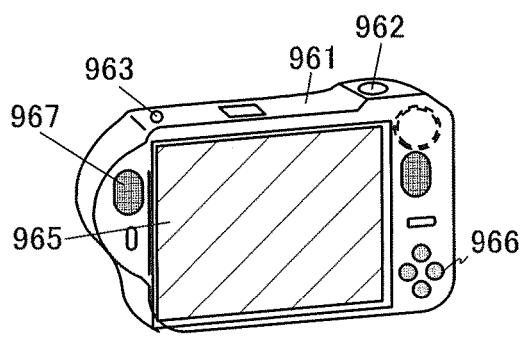

FIG. 20C illustrates a digital camera, which includes a housing 961, a shutter button 962, a microphone 963, a speaker 967, a display portion 965, operation keys 966, and the like. The display portion 965 of the digital camera includes the display device of one embodiment of the present invention, so that outdoor visibility can be improved and low power consumption can be realized.

Figure 20D:
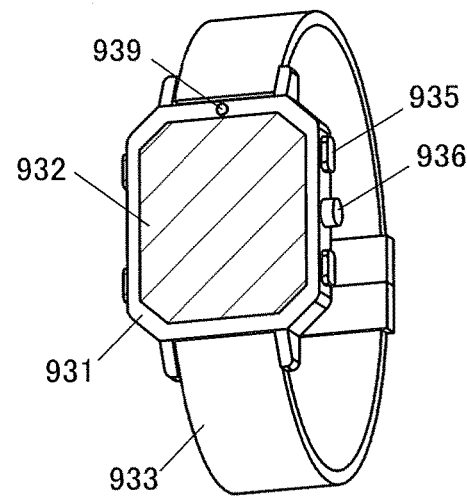

FIG. 20D illustrates a wrist-watch-type information terminal, which includes a housing 931, a display portion 932, a wristband 933, operation buttons 935, a winder 936, a camera 939, and the like. The display portion 932 may be a touch panel. The display portion 932 of the information terminal includes the display device of one embodiment of the present invention, so that outdoor visibility can be improved. Furthermore, the bezel can be narrowed, and thus the design can be improved.

Figure 20E:
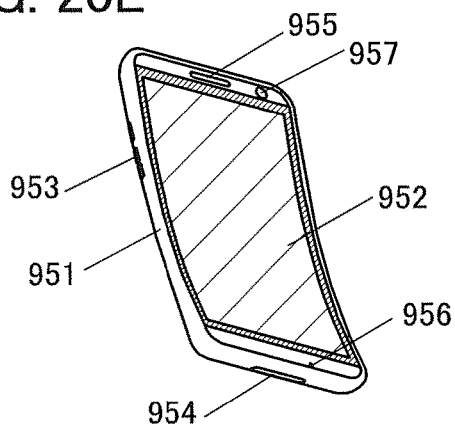

FIG. 20E is an example of a mobile phone, which includes a housing 951, a display portion 952, an operation button 953, an external connection port 954, a speaker 955, a microphone 956, a camera 957, and the like. The mobile phone includes a touch sensor in the display portion 952. Operations such as making a call and inputting a character can be performed by touch on the display portion 952 with a finger, a stylus, or the like. The display portion 952 of the mobile phone includes the display device of one embodiment of the present invention, so that outdoor visibility can be improved. Furthermore, the bezel can be narrowed, and thus the design can be improved.

Figure 20F:
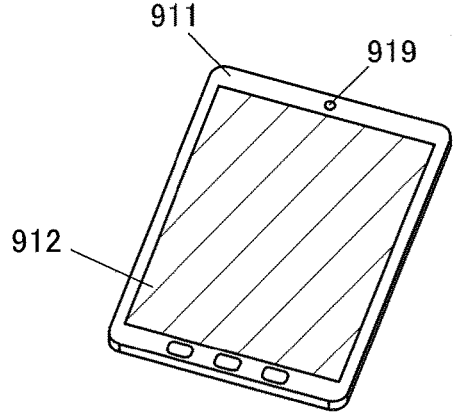

FIG. 20F illustrates a portable data terminal, which includes a housing 911, a display portion 912, a camera 919, and the like. The touch panel function of the display portion 912 enables input and output of information. The display portion 912 of the portable data terminal includes the portable data terminal of one embodiment of the present invention, so that outdoor visibility can be improved. Furthermore, the bezel can be narrowed, and thus the portable data terminal can be small.

At least part of this embodiment can be implemented in combination with any of the other embodiments described in this specification as appropriate.

This application is based on Japanese Patent Application serial No. 2016-135142 filed with Japan Patent Office on Jul. 7, 2016, the entire contents of which are hereby incorporated by reference.

What is claimed is:

1. A display device comprising:
   a pixel circuit; and
   a driver circuit,
   wherein the pixel circuit and the driver circuit are provided on one plane,
   wherein the driver circuit comprises a selection circuit and a buffer circuit,
   wherein the buffer circuit comprises a first transistor and a second transistor,
   wherein the second transistor has a region overlapping with the first transistor,
   wherein a source of the first transistor is electrically connected to a source of the second transistor,
   wherein a drain of the first transistor is electrically connected to a drain of the second transistor,
   wherein a gate of the first transistor is electrically connected to a gate of the second transistor,
   wherein the gate of the first transistor and the gate of the second transistor are electrically connected to the selection circuit, and
   wherein the sources of the first transistor and the second transistor or the drains of the first transistor and the second transistor are electrically connected to the pixel circuit.

2. The display device according to claim 1, wherein the first transistor and the second transistor are stacked so that a direction of the current flow in the first transistor is parallel to a direction of the current flow in the second transistor.

3. The display device according to claim 1, wherein transistors in the driver circuit and the pixel circuit have the same conductivity.

4. The display device according to claim 1, wherein transistors in the driver circuit and the pixel circuit each comprise a metal oxide in a channel formation region.

5. The display device according to claim 1, wherein a channel width of the first transistor is equal to a channel width of the second transistor.

6. The display device according to claim 1,
   wherein the pixel circuit comprises a first display element, and
   wherein the first display element is configured to emit or transmit visible light.

7. The display device according to claim 6,
   wherein the pixel circuit further comprises a second display element, and
   wherein the second display element is configured to reflect visible light.

8. An electronic device comprising:
   the display device according to claim 1; and
   a touch sensor in a position overlapping with the display device.

9. A display device comprising:
   a pixel circuit; and
   a driver circuit,
   wherein the pixel circuit and the driver circuit are provided on one plane,
   wherein the driver circuit comprises a selection circuit and a buffer circuit,
   wherein the buffer circuit comprises a first transistor and a second transistor,
   wherein the pixel circuit comprises a third transistor and a fourth transistor, wherein the second transistor has a region overlapping with the first transistor, wherein the fourth transistor has a region overlapping with the third transistor, wherein a source of the first transistor is electrically connected to a source of the second transistor, wherein a drain of the first transistor is electrically connected to a drain of the second transistor, wherein a gate of the first transistor is electrically connected to a gate of the second transistor, wherein the gate of the first transistor and the gate of the second transistor are electrically connected to the selection circuit, and wherein the sources of the first transistor and the second transistor or the drains of the first transistor and the second transistor are electrically connected to a gate of the third transistor.

10. The display device according to claim 9, wherein the first transistor and the second transistor are stacked so that a direction of the current flow in the first transistor is parallel to a direction of the current flow in the second transistor.

11. The display device according to claim 9, wherein transistors in the driver circuit and the pixel circuit have the same conductivity.

12. The display device according to claim 9, wherein transistors in the driver circuit and the pixel circuit each comprise a metal oxide in a channel formation region.

13. The display device according to claim 9, wherein a channel width of the first transistor is equal to a channel width of the second transistor.

14. The display device according to claim 9,
wherein the pixel circuit comprises a first display element, and
wherein the first display element is configured to emit or transmit visible light.

15. The display device according to claim 14,
wherein the pixel circuit further comprises a second display element, and
wherein the second display element is configured to reflect visible light.

16. An electronic device comprising:
the display device according to claim 9; and
a touch sensor in a position overlapping with the display device.

17. A display device comprising:
a pixel circuit; and
a buffer circuit comprising a first transistor and a second transistor,
wherein the second transistor overlaps with the first transistor,
wherein a source of the first transistor is electrically connected to a source of the second transistor,
wherein a drain of the first transistor is electrically connected to a drain of the second transistor,
wherein a gate of the first transistor is electrically connected to a gate of the second transistor, and
wherein the sources of the first transistor and the second transistor or the drains of the first transistor and the second transistor are electrically connected to the pixel circuit.

18. The display device according to claim 17, wherein the first transistor and the second transistor are stacked so that a direction of the current flow in the first transistor is parallel to a direction of the current flow in the second transistor.

19. The display device according to claim 17, wherein a channel width of the first transistor is equal to a channel width of the second transistor.

20. The display device according to claim 17,
wherein the pixel circuit comprises a first display element, and
wherein the first display element is configured to emit or transmit visible light.

21. The display device according to claim 20,
wherein the pixel circuit further comprises a second display element, and
wherein the second display element is configured to reflect visible light.

22. An electronic device comprising:
the display device according to claim 17; and
a touch sensor in a position overlapping with the display device.

* * * * *